US009767999B2

(12) United States Patent
Jepson et al.

(10) Patent No.: US 9,767,999 B2
(45) Date of Patent: *Sep. 19, 2017

(54) REFRACTORY METAL PLATES

(71) Applicant: H.C. STARCK INC., Newton, MA (US)

(72) Inventors: Peter R. Jepson, Newbury, MA (US); Dincer Bozkaya, Framingham, MA (US)

(73) Assignee: H.C. STARCK INC., Newton, MA (US)

( * ) Notice: Subject to any disclaimer, the term of this patent is extended or adjusted under 35 U.S.C. 154(b) by 202 days.

This patent is subject to a terminal disclaimer.

(21) Appl. No.: 14/751,224

(22) Filed: Jun. 26, 2015

(65) Prior Publication Data
US 2015/0294844 A1  Oct. 15, 2015

Related U.S. Application Data

(63) Continuation of application No. 12/221,646, filed on Aug. 5, 2008, now Pat. No. 9,095,885.

(60) Provisional application No. 60/963,616, filed on Aug. 6, 2007.

(51) Int. Cl.
H01J 37/34 (2006.01)
B21B 1/22 (2006.01)
B22F 3/18 (2006.01)
C22F 1/18 (2006.01)
C23C 14/34 (2006.01)
B21B 39/04 (2006.01)

(52) U.S. Cl.
CPC .......... H01J 37/3426 (2013.01); B21B 1/227 (2013.01); B22F 3/18 (2013.01); C22F 1/18 (2013.01); C23C 14/3414 (2013.01); B21B 39/04 (2013.01); B21B 2265/24 (2013.01); B21B 2267/065 (2013.01); B21B 2273/02 (2013.01); Y10T 428/12 (2015.01); Y10T 428/12014 (2015.01); Y10T 428/12458 (2015.01)

(58) Field of Classification Search
CPC ... B21B 1/227; B21B 39/04; B21B 2267/065; B21B 2273/02; B22F 3/18; C22F 1/18; C23C 14/3414; C22C 27/02
See application file for complete search history.

(56) References Cited

U.S. PATENT DOCUMENTS

| | | | |
|---|---|---|---|
| 1,852,271 A | 4/1932 | Smith et al. | |
| 2,123,291 A | 7/1938 | Smitmans | |
| 2,250,541 A | 7/1941 | Lessmann | |
| 3,811,305 A | 5/1974 | Saylor, Jr. | |
| 4,086,105 A | 4/1978 | Mayrhofer et al. | |
| 4,385,511 A | 5/1983 | Vydrin | |
| 4,473,416 A | 9/1984 | Kawamo et al. | |
| 5,119,729 A | 6/1992 | Nguyen | |
| 5,242,481 A | 9/1993 | Kumar | |
| 5,850,755 A | 12/1998 | Segal | |
| 5,992,201 A | 11/1999 | Ginzburg | |
| 6,331,233 B1 | 12/2001 | Turner | |
| 6,348,113 B1 | 2/2002 | Michaluk et al. | |
| 6,348,139 B1 | 2/2002 | Shah et al. | |
| 6,462,339 B1 | 10/2002 | Michaluk et al. | |
| 6,519,994 B1 | 2/2003 | Quambusch | |
| 6,521,173 B2 | 2/2003 | Kumar et al. | |
| 6,761,053 B2 | 7/2004 | Tazoe | |
| 6,766,934 B2 | 7/2004 | Ziegelaar et al. | |
| 6,770,154 B2 | 8/2004 | Koenigsmann et al. | |
| 6,893,513 B2 | 5/2005 | Michaluk et al. | |
| 6,908,517 B2 | 6/2005 | Segal et al. | |
| 6,976,380 B1 | 12/2005 | Hartwig et al. | |
| 7,067,197 B2 | 6/2006 | Michaluk et al. | |
| 7,081,148 B2 | 7/2006 | Koenigsmann et al. | |
| 7,228,722 B2 | 6/2007 | Spreckelsen et al. | |
| 7,341,096 B2 | 3/2008 | Van Der Winden | |
| 7,485,198 B2 | 2/2009 | Michaluk | |
| 7,998,287 B2 | 8/2011 | Wickersham et al. | |
| 9,095,885 B2* | 8/2015 | Jepson | B21B 1/227 |
| 2002/0041819 A1 | 4/2002 | Kumar et al. | |
| 2002/0112789 A1 | 8/2002 | Jepson | |
| 2003/0168131 A1 | 9/2003 | Michaluk et al. | |
| 2004/0141870 A1 | 7/2004 | Michaluk et al. | |
| 2005/0223848 A1 | 10/2005 | Ueno et al. | |
| 2005/0247386 A1 | 11/2005 | Matera et al. | |
| 2006/0201589 A1 | 9/2006 | Morales et al. | |

(Continued)

FOREIGN PATENT DOCUMENTS

CN  102513537 A  6/2012
EP  1137820 A1  6/2000

(Continued)

OTHER PUBLICATIONS

Search Report for Taiwan Patent Application, Application No. 104111728, dated Aug. 16, 2016.
International Preliminary Report on Patentability, Application No. PCT/US2015/024928 dated Aug. 18, 2016.
Moll, John J., "Utilization of Gas-Atomized Titanium and Titanium-Aluminide Powder" JOM, Springer New York LLC, United States, vol. 52, No. 5, dated May 1, 2000. pp. 32-42.
Japanese Office Action, Application No. 2013-143996 dated May 24, 2016.
International Search Report, Application No. PCT/US2015/024928, dated Jul. 16, 2015.
Second Written Opinion of the International Preliminary Examining Authority, Application No. PCT/US2015/024928, dated Mar. 23, 2016.

(Continued)

Primary Examiner — Jessee Roe
(74) Attorney, Agent, or Firm — Morgan, Lewis & Bockius LLP

(57) ABSTRACT

A refractory metal plate is provided. The plate has a center, a thickness, an edge, a top surface and a bottom surface, and has a crystallographic texture (as characterized by through thickness gradient, banding severity; and variation across the plate, for each of the texture components 100//ND and 111//ND, which is substantially uniform throughout the plate.

20 Claims, 16 Drawing Sheets

(56) References Cited

U.S. PATENT DOCUMENTS

| | | |
|---|---|---|
| 2007/0023281 A1 | 2/2007 | Oda |
| 2007/0144623 A1 | 6/2007 | Wickersham |
| 2008/0271779 A1 | 11/2008 | Miller et al. |
| 2013/0039796 A1 | 2/2013 | L'Esperance et al. |

FOREIGN PATENT DOCUMENTS

| | | |
|---|---|---|
| EP | 1066899 A2 | 1/2001 |
| EP | 1265717 B1 | 6/2001 |
| EP | 2017362 A1 | 1/2009 |
| EP | 2784173 A1 | 10/2014 |
| JP | 55165217 | 12/1980 |
| JP | 03032404 | 2/1991 |
| JP | 2004-526863 A1 | 9/2004 |
| JP | 2006-517612 A | 7/2006 |
| JP | 2007-516352 A | 6/2007 |
| KR | 10-0528090 B1 | 11/2005 |
| SU | 931244 | 5/1982 |
| TW | 201011116 A1 | 3/2010 |
| WO | 99/02743 | 1/1999 |
| WO | 03/018221 A2 | 3/2003 |
| WO | 2004/111295 A1 | 12/2004 |
| WO | 2005/045090 A1 | 5/2005 |
| WO | 2006/026621 A2 | 3/2006 |
| WO | 2009/020587 A1 | 2/2009 |
| WO | 2009/151032 A1 | 12/2009 |
| WO | 2013/065362 A1 | 10/2014 |

OTHER PUBLICATIONS

Mathaudhu, Suveen N., "Processing microstructure property relationships in severely deformed tantalum", Materials Science and Engineering A 463, (2007), pp. 94-100.

International Search Report and Written Opinion of Corresponding PCT, Application No. PCT/US2008/009388, dated Aug. 5, 2008, published as WO 2009/020587 on Feb. 12, 2009.

International Preliminary Report of Corresponding PCT, Application No. PCT/US2008/009388, dated Aug. 5, 2008, published as WO 2009/020587 on Feb. 12, 2009.

Mathaudhu, S.N. and Hartwig, T., Processing Microstructure Property Relationships in Severely Deformed Tantalum, Materials Science and Engineering A, 463, 2007, 94-100.

Office Action mailed on Oct. 27, 2011 from the U.S. Patent Office for U.S. Appl. No. 12/221,759.

Office Action mailed on May 5, 2011 from the U.S. Patent Office for U.S. Appl. No. 12/221,759.

Office Action from Japan Patent Office for copending Japanese Patent Application 2010-519963, dated Jan. 9, 2013, including translation.

International Search Report and Written Opinion of Corresponding PCT, Application No. PCT /US2008/009446, dated Aug. 6, 2008, published as WO 2009/020619 on Feb. 12, 2009.

International Preliminary Report of Corresponding PCT, Application No. PCT/US2008/009446, dated Aug. 6, 2008, published as WO 2009/020619 on Feb. 12, 2009.

Zhang, F., et al. "Experimental and simulation textures in an asymmetrically rolled zinc alloy sheet", Script Materialla 50 (2004) 1011-1015.

Jin, H. et al. Reduction of planar anisotropy by texture modification through asymmetric rolling and annealing in AA5754, Materials Science & Engineering A 399 (2005) 358-367.

Jin, H., et al., "Evolution of texture in AA6111 aluminum alloy after asymmetric rolling with various velocity ratios between top and bottom rolls", Materials Science & Engineering A 465 (2007) 267-273.

Kim, S-H, et. al. Texture and microstructure changes in asymmetrically hot rolled AZ31 magnesium alloy sheets, Materials Letters 59 (2005) 3876-3880.

Lee, J-K, et al. "Texture control and grain refinement of AA1050 A1 alloy sheets by asymmetric rolling", International Journal of Mechanical Sciences 50 (2008) 869-887.

Sha, Y., et al. "Improvement of recrystallization texture and magnetic property in non-oriented silicon steel by asymmetric rolling", J. of Magnetic Materials 320 (2008) 393-396.

Kim, J-K, et al., Formulation of textures and microstructures in asymmetrically cold rolled and subsequently annealed aluminum alloy 1100 sheets, J. of Materials Science 39 (2004) 5365-5369.

Lee, S., et al. "Analysis of deformation textures of asymmetrically rolled steel sheets", International Journal of Mechanical Sciences 43 (2001) 1997-2015.

Lee, D., "Strain energy release maximization model for evolutionof recrystallization textures", International Journal of Mechanical Sciences 42 (2000) 1645-1678.

Park, Y.B., et al., The evolution of recrystallization textures in body centred cubic metals, Acta Mater., vol. 46, No. 10 (1998) 3371-3379.

Shivupri et al., "Finite element investigation of curling in non-symmetric rolling of flat stock", Int. J. of Mech. Sci. vol. 30, 1988.

Knight et al., "Investigations into the influence of asymmetric factors and rolling parameters on strip curvature during hot rolling", J. Mat. Proc. Tech., vol. 134, 2003.

Office Action from Japan Patent Office for copending Japanese Patent Application 2013-143996, dated Aug. 6, 2014.

Office Action from the European Patent Office for copending patent application EP 08795025.9-1353, dated Nov. 25, 2013.

Office Action from the Korean Intellectual Property Office for copending Korean patent application 10-2010-7002603 dated Mar. 13, 2012.

Pokross, Controlling the Texture of Tantalum Plate, JOM Oct. 1989, pp. 46-49.

Field et al., Microstructural Development in Asymmetric Processing of Tantalum Plate, J. of Electronic Materials, vol. 34, No. 12, 2005, pp. 1521-1525.

Zhang et al., Effect of Grain Orientation on Tantalum Magnetron SputteringYield, J. Vac. Sci. Technol. vol. 24, Issue 4, Jul. 2006, pp. 1107-1111.

Wickersham et al., Measurement of Angular Emission Trajectories for Magnetron-Sputtered Tantalum, J. Electronic Materials, vol. 34, No. 12, 2005.

Jin, et al., Development of Grain Structure and Texture during Annealing in Asymmetrically Rolled AA5754, Materials Science Forum, vols. 467-470 (2004), pp. 381-386.

Clark, et al., Influence of Transverse Rolling on the Microstructural and Texture Development in Pure Tantalum, Metallurgical Transactions A, vol. 23A, Aug. 1992, pp. 2183-2191.

Clark, et al., Effect of Processing Variables on Texture and Texture Gradients in Tantalum, Metallurgical Transactions A, vol. 22A, Sep. 1991, pp. 2039-2048.

Morra, M.M. et al., Uniformity of Properties in Alloy 706 Through Control of Forging, The Minerals, Metals & Materials Society, 1997, 279-290.

Michaluk, Christopher A. et al., Quantifying the Recrystallization Texture of Tantalum, JOM, Mar. 2002, 51-54.

Pugh, J. W. et al., Rolling Texture in Tantalum, Transactions of the ASM, vol. 48, 1956, 526-539.

\* cited by examiner

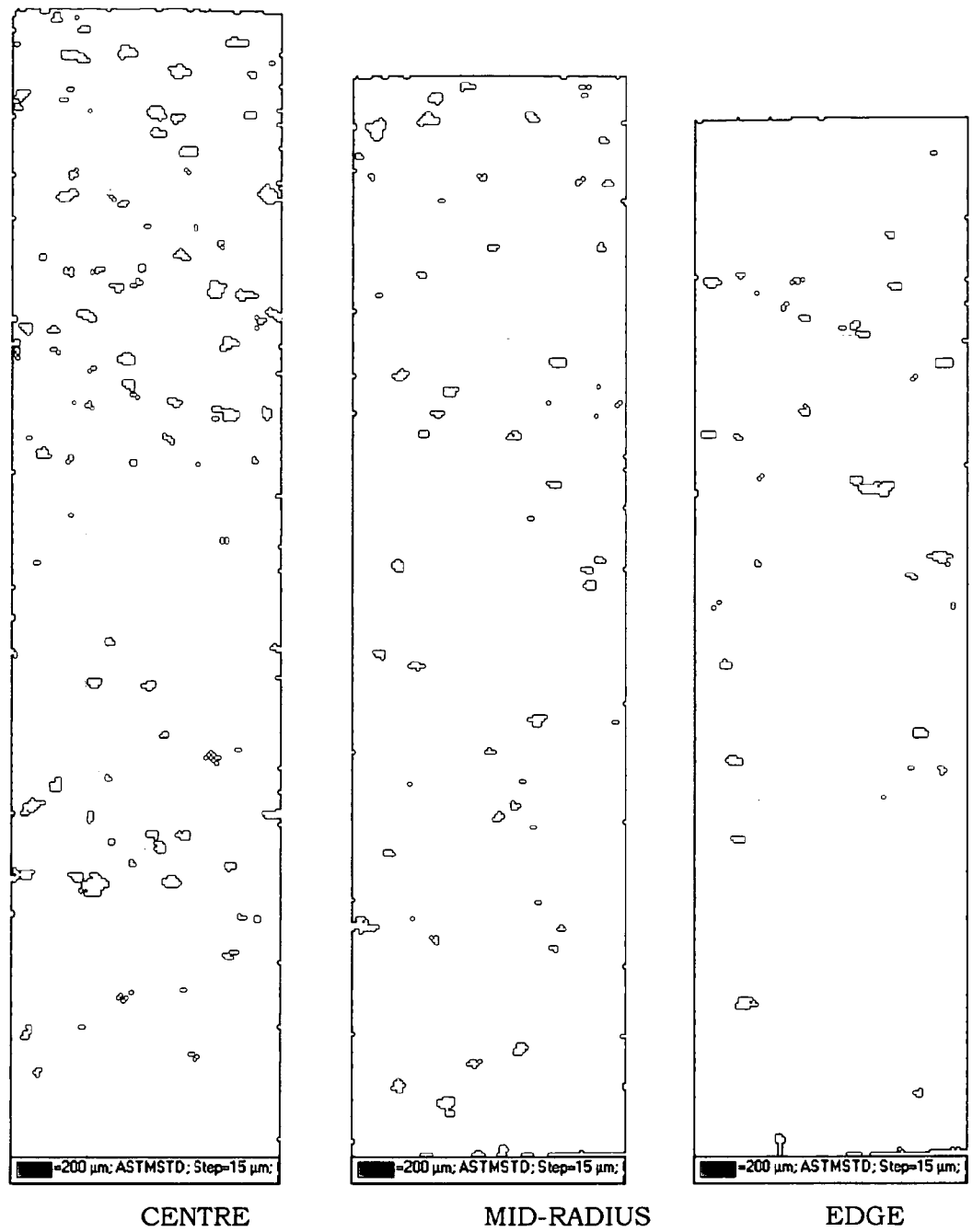
FIGURE 1A, 1B, 1C – EXAMPLE 1

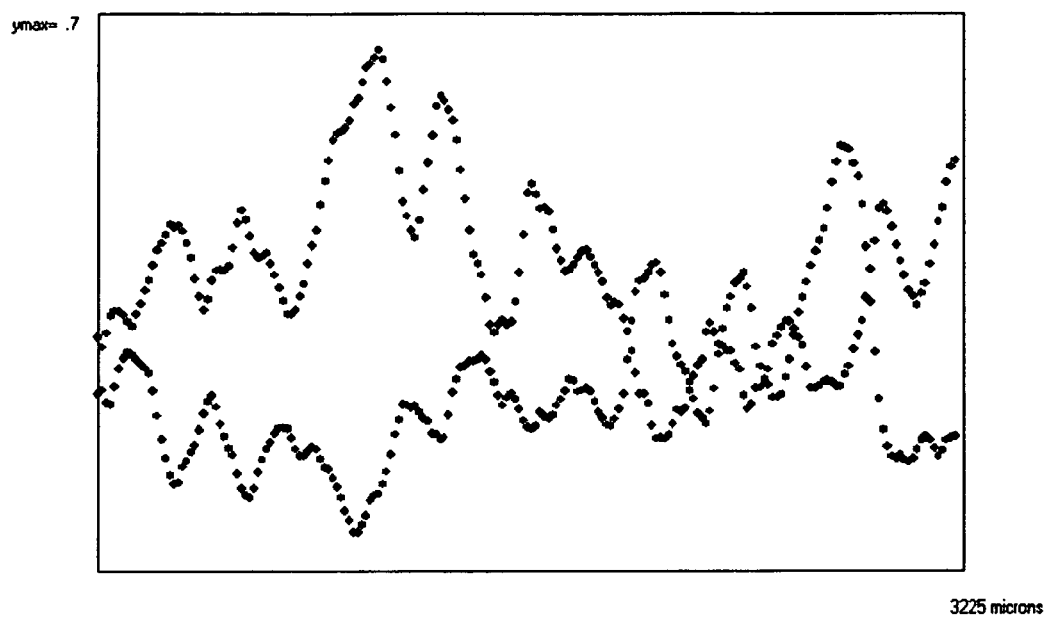
CENTRE – H1
FIGURE 1D – EXAMPLE 1

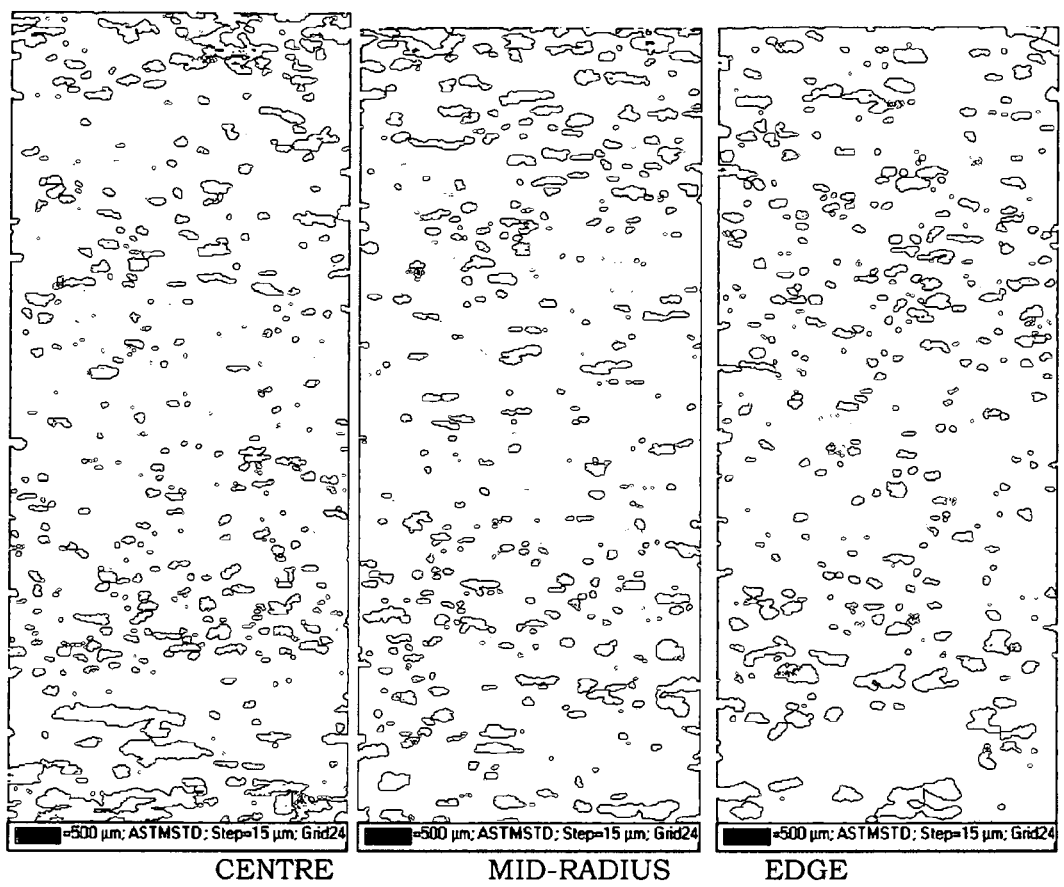
FIGURES 2A, 2B, 2C – EXAMPLE 2

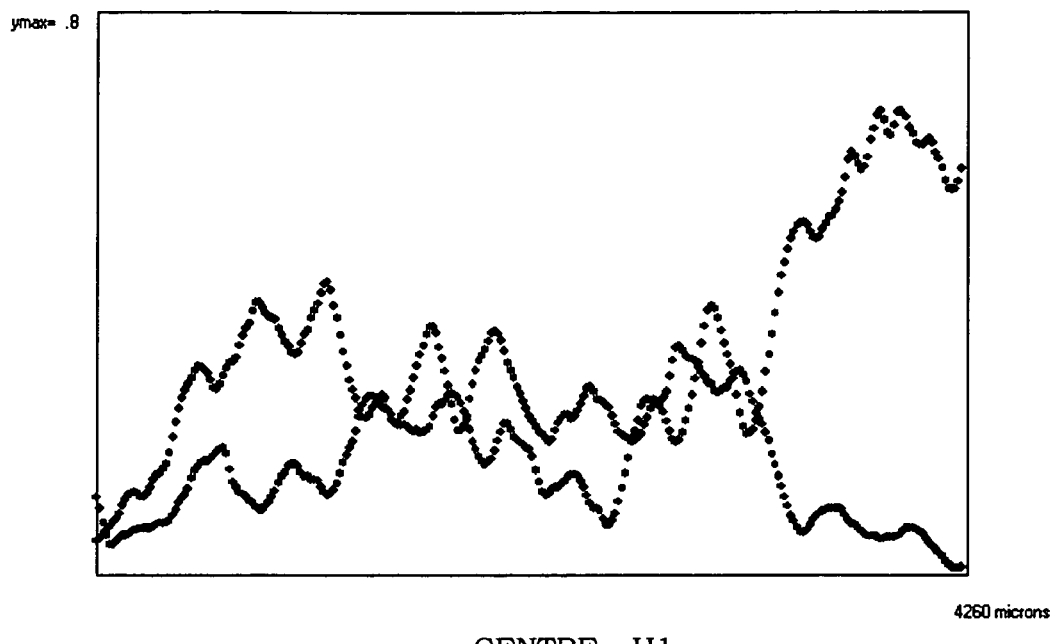
CENTRE – H1
FIGURE 2D – EXAMPLE 2

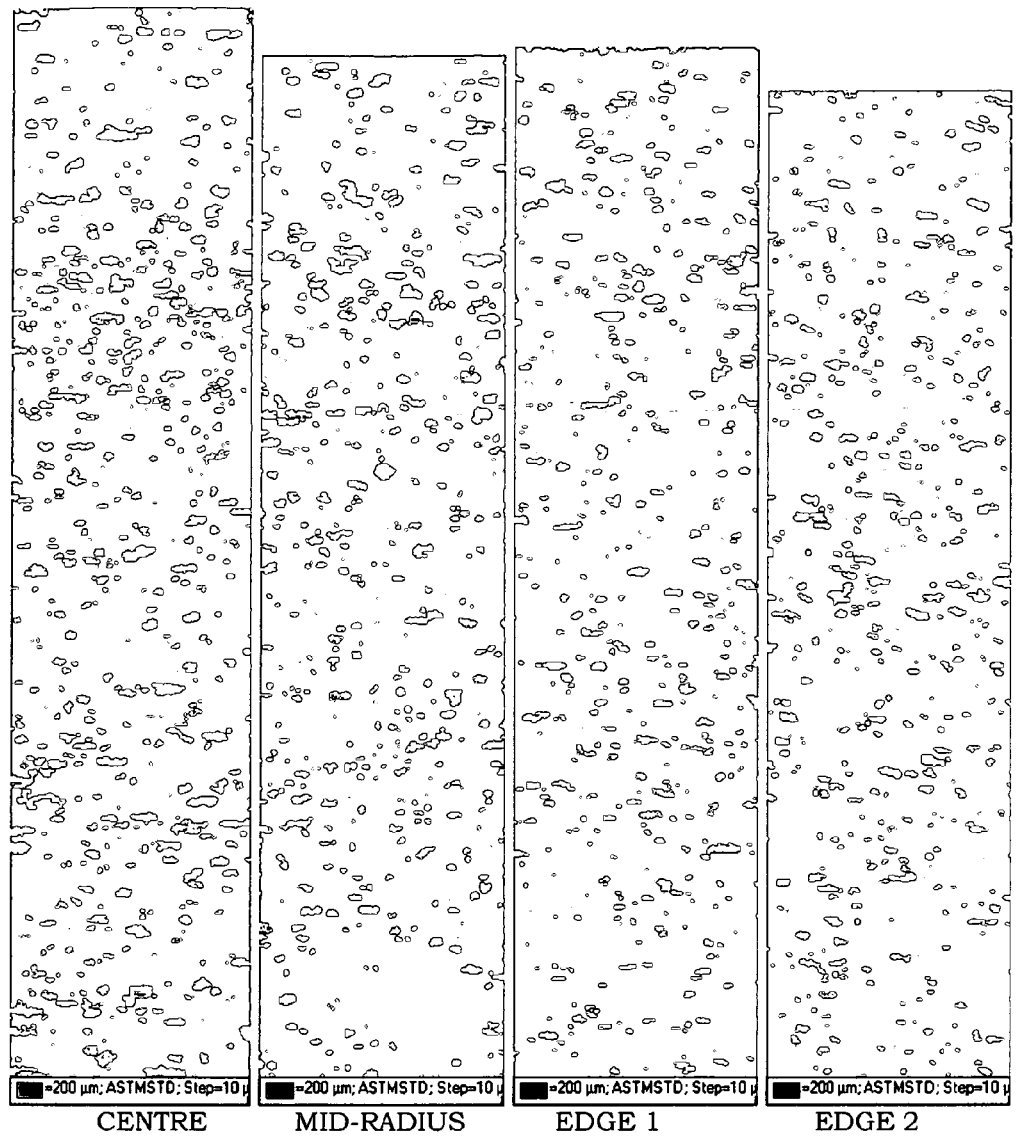
FIGURES 3A, 3B, 3C, 3D – EXAMPLE 3, PLATE 1

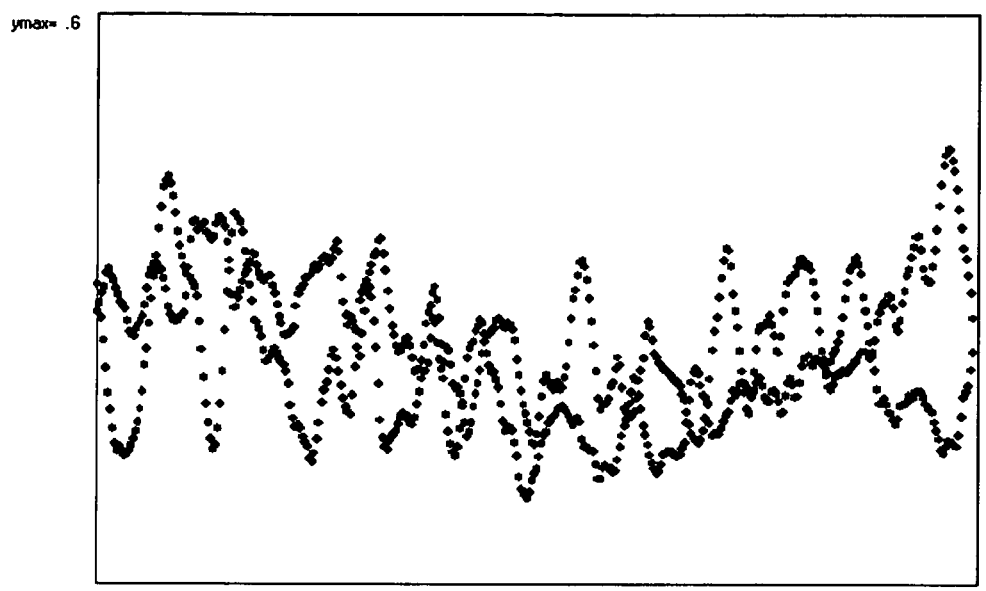
CENTRE – H1
FIGURE 3E – EXAMPLE 3, PLATE 1

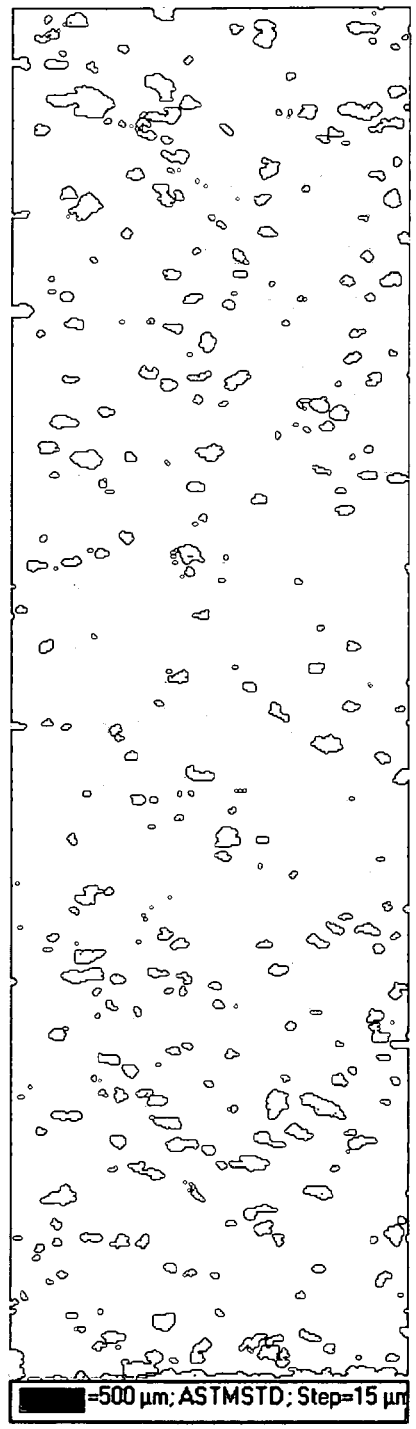 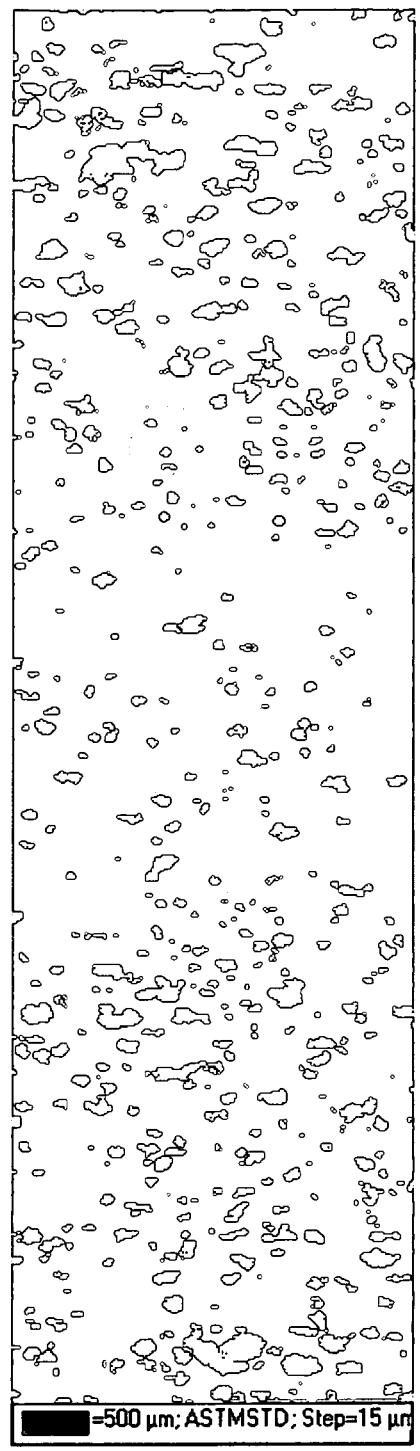
PLATE 10          PLATE 11
FIGURE 4A, 4B – EXAMPLE 4, PLATES 10 and 11

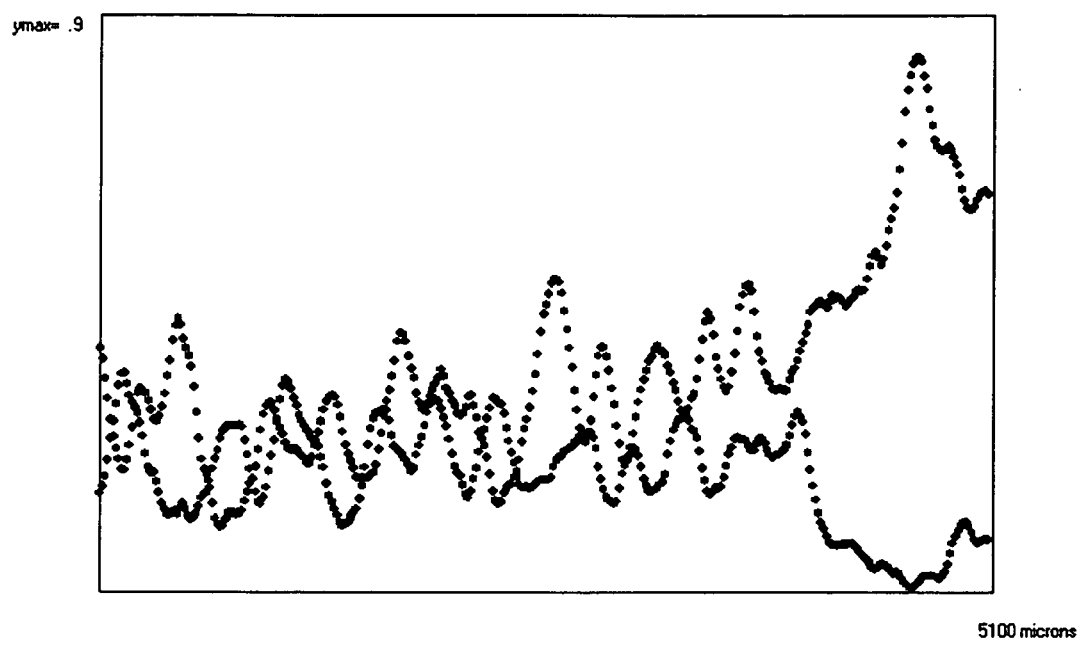
PLATE 10 – H1
FIGURE 4C – EXAMPLE 4, PLATE 10

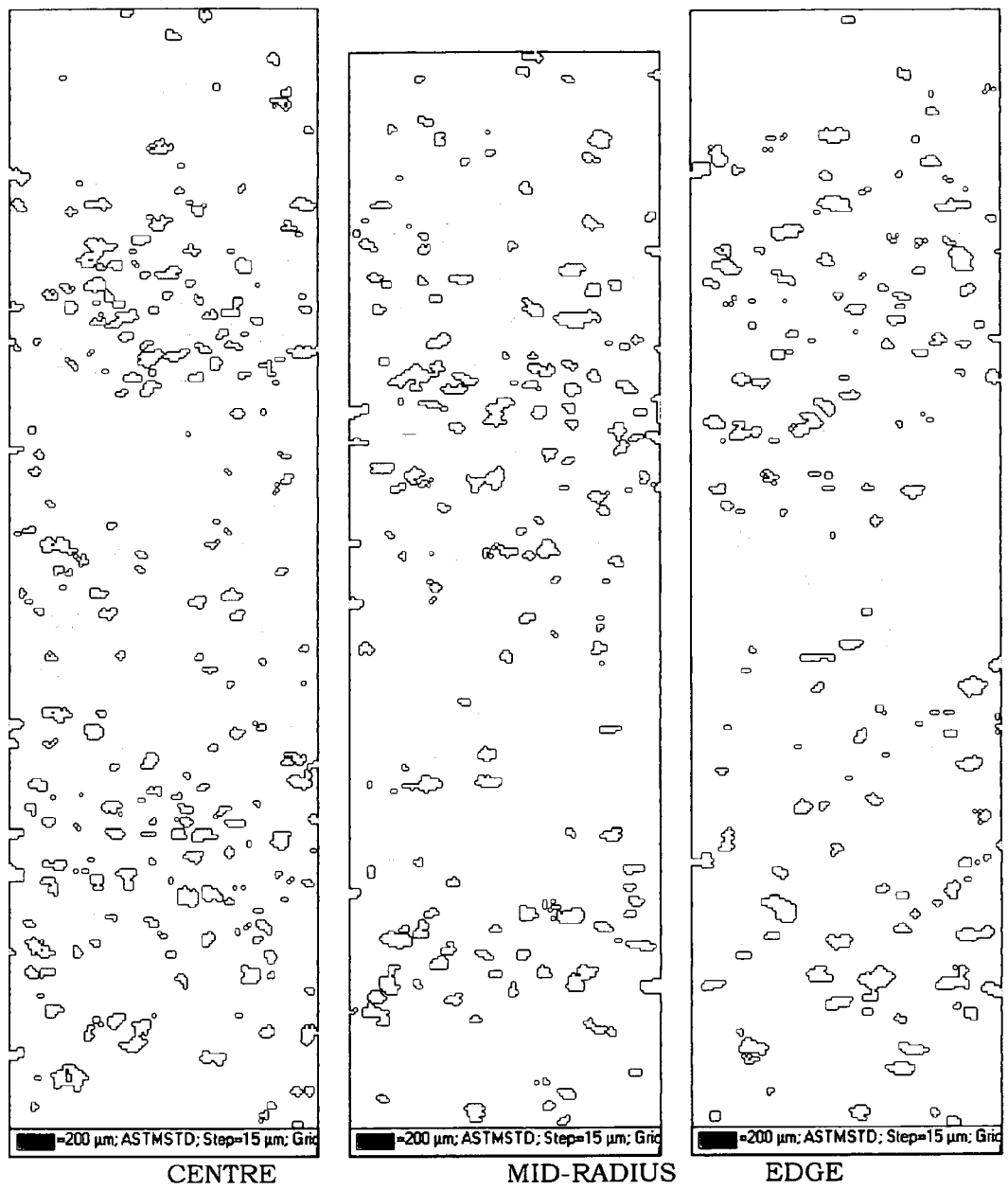
FIGURES 5A, 5B, 5C – EXAMPLE 5

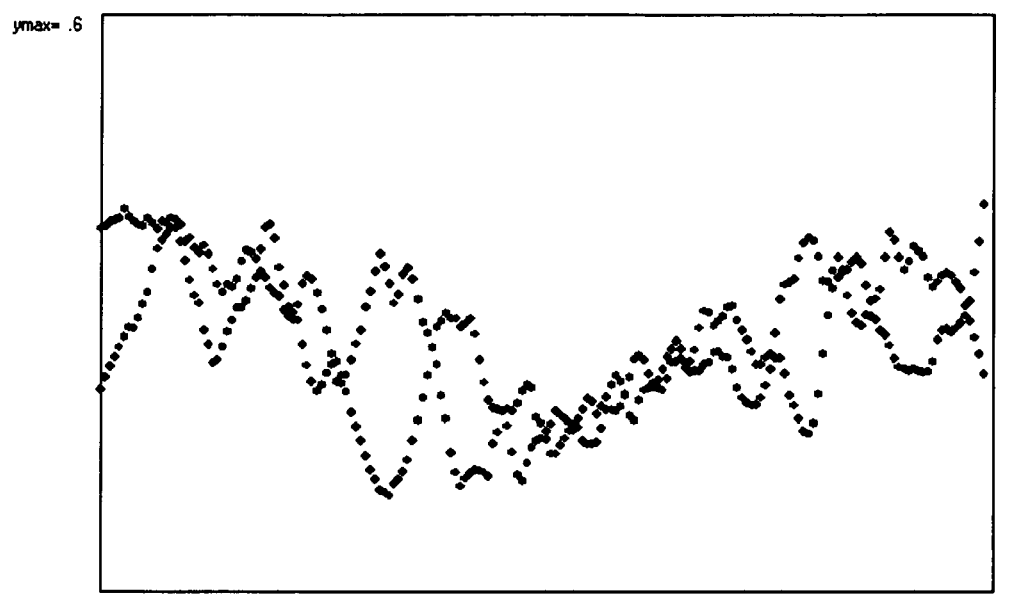
CENTRE – H1
FIGURE 5D – EXAMPLE 5

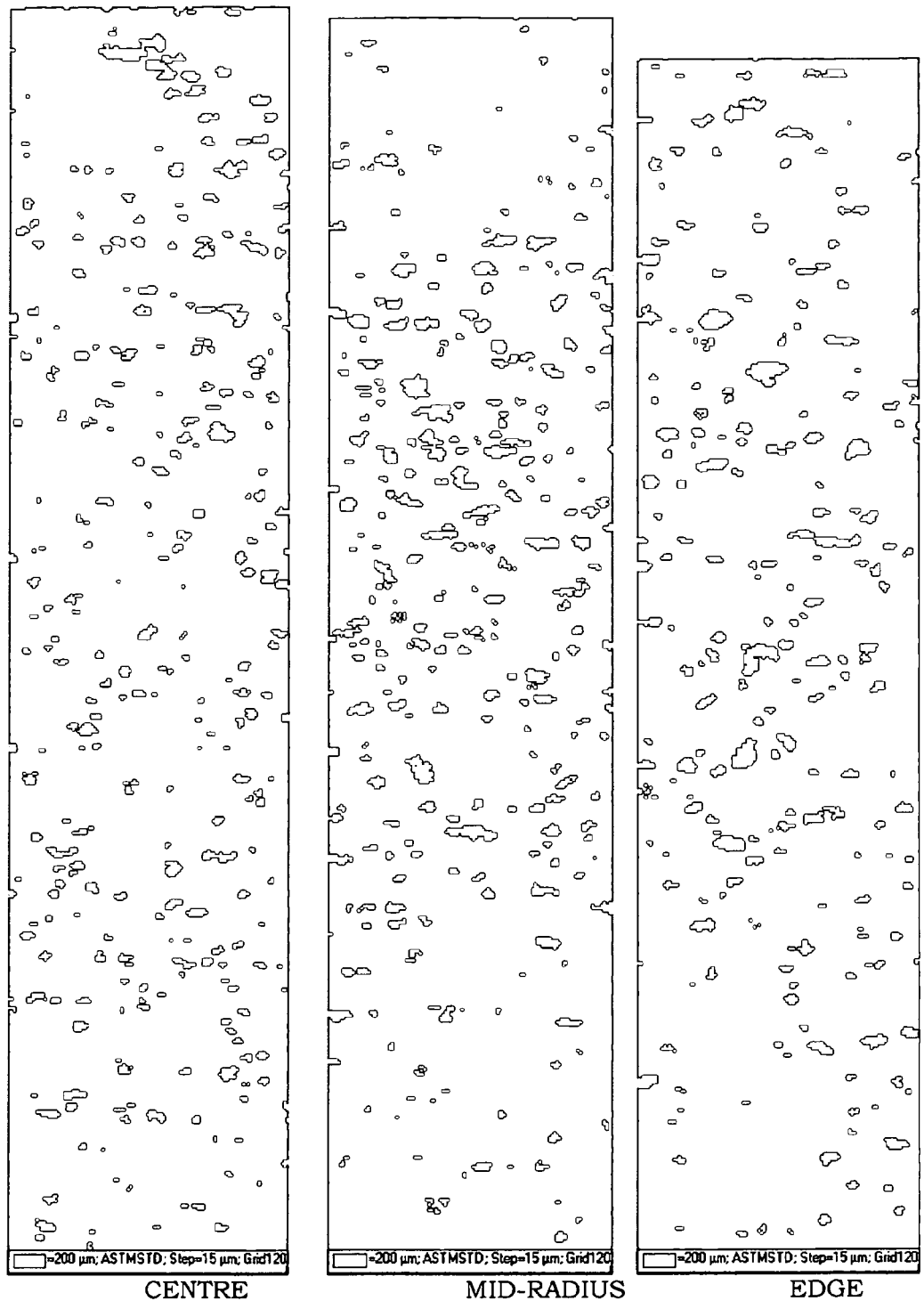
FIGURES 6A, 6B, 6C – EXAMPLE 6

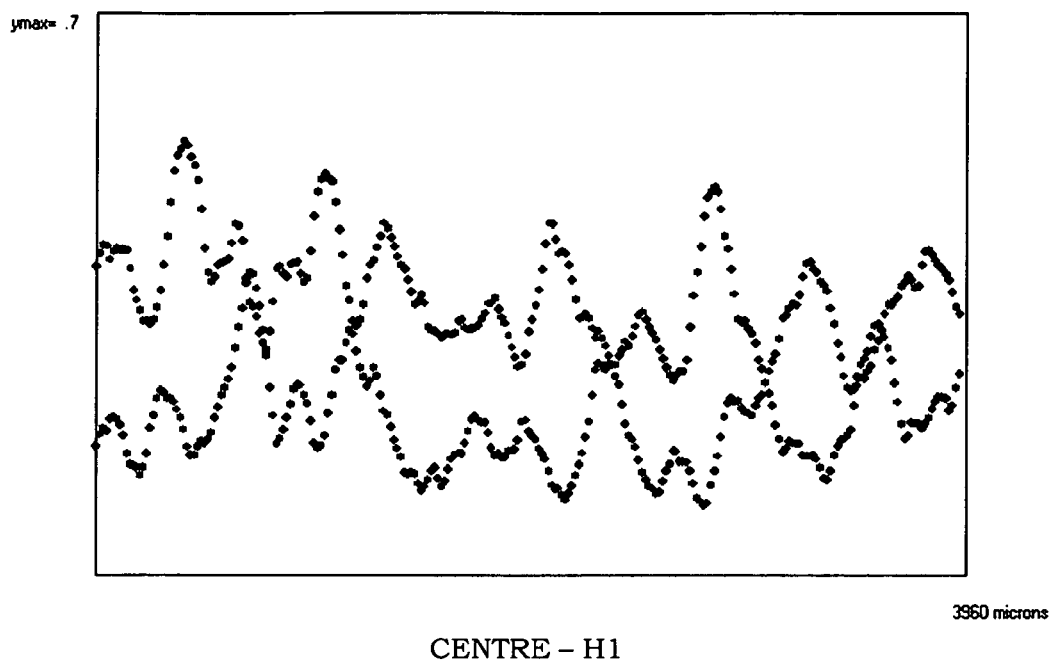
CENTRE – H1
FIGURE 6D - EXAMPLE 6

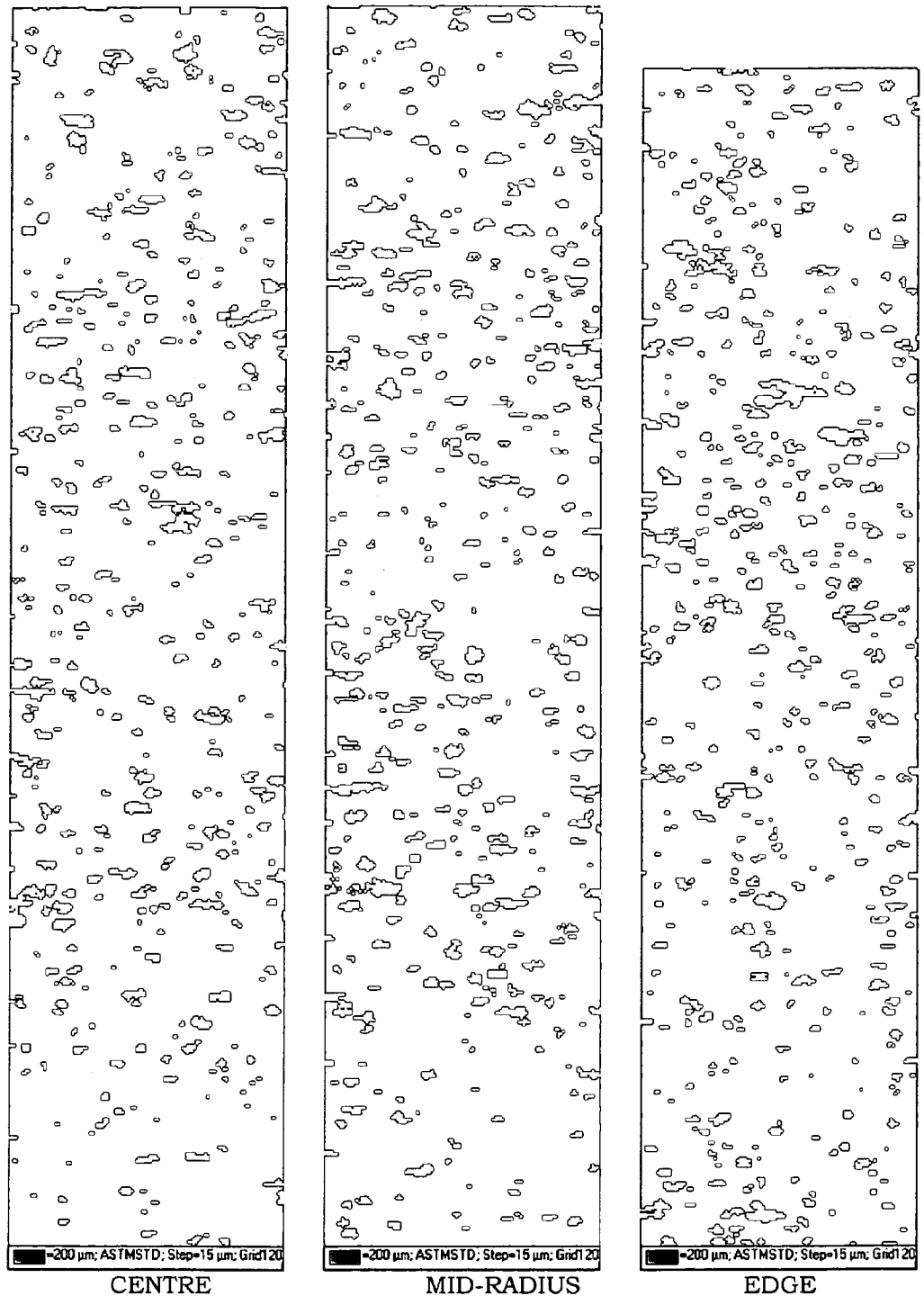
FIGURES 7A, 7B, 7C – EXAMPLE 7

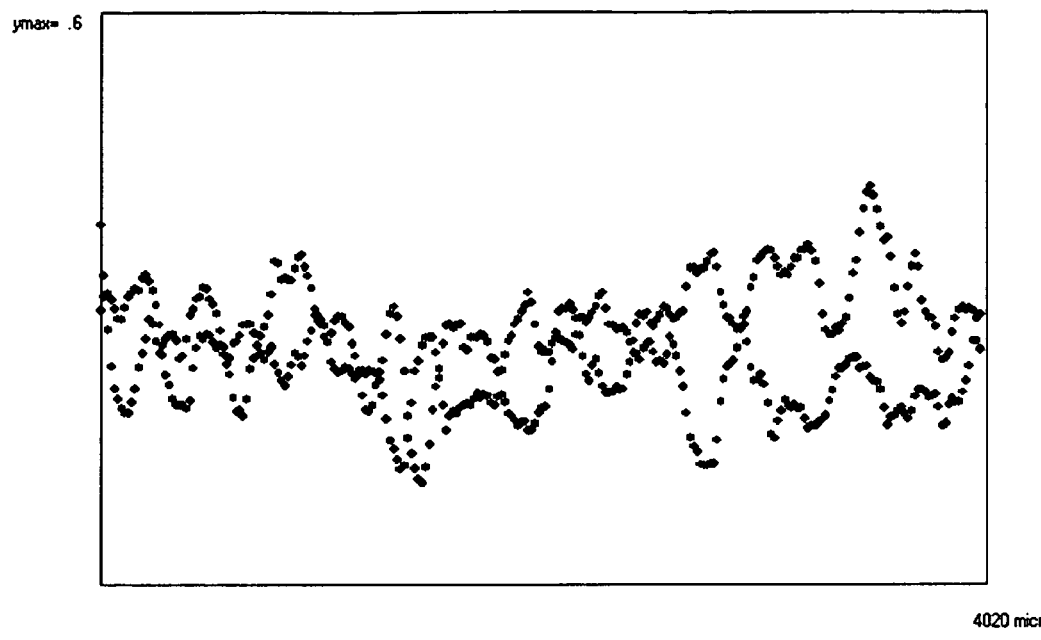
CENTRE – H1
FIGURE 7D – EXAMPLE 7

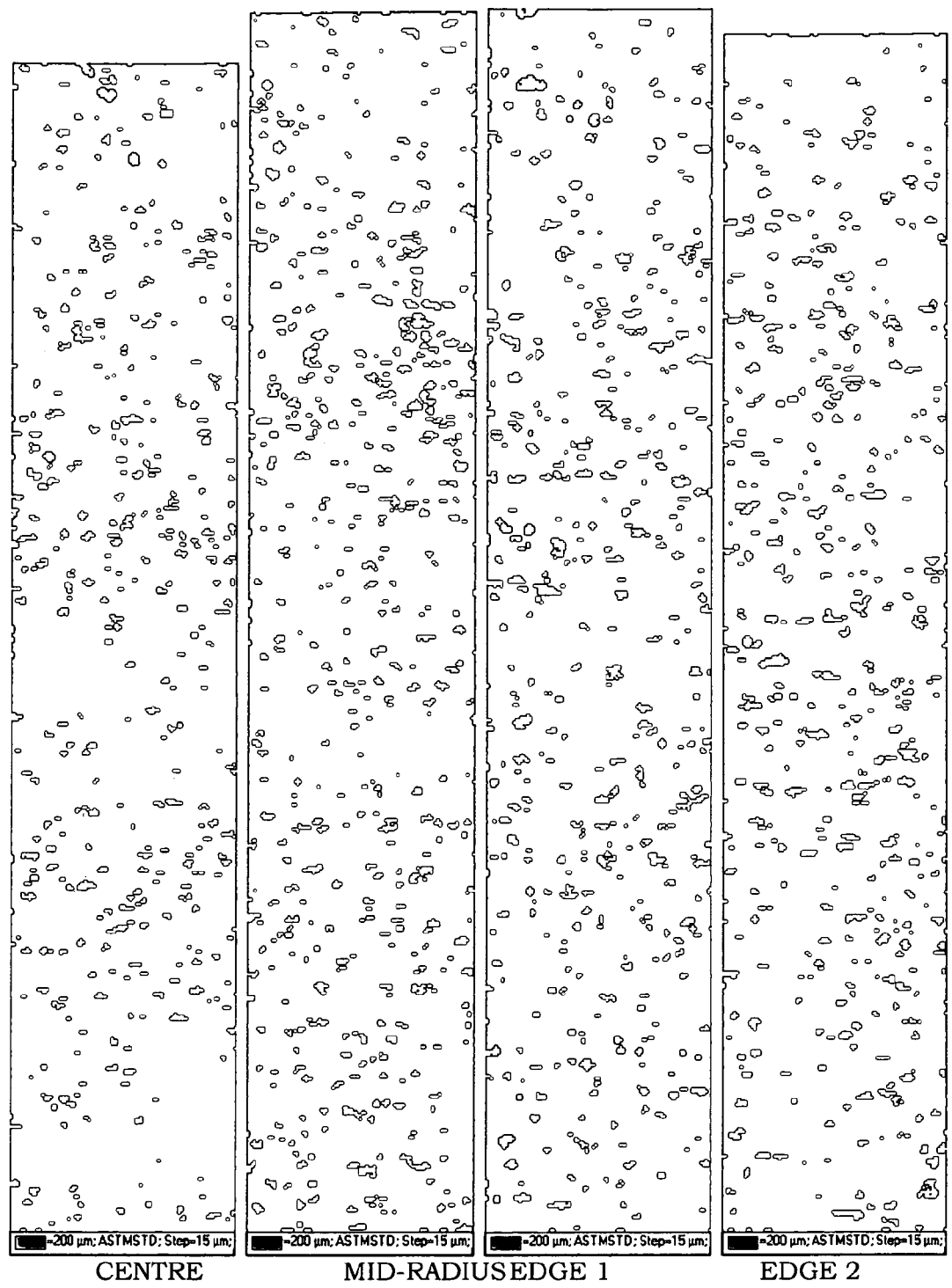
FIGURES 8A, 8B, 8C, 8D – EXAMPLE 8, PLATE 1

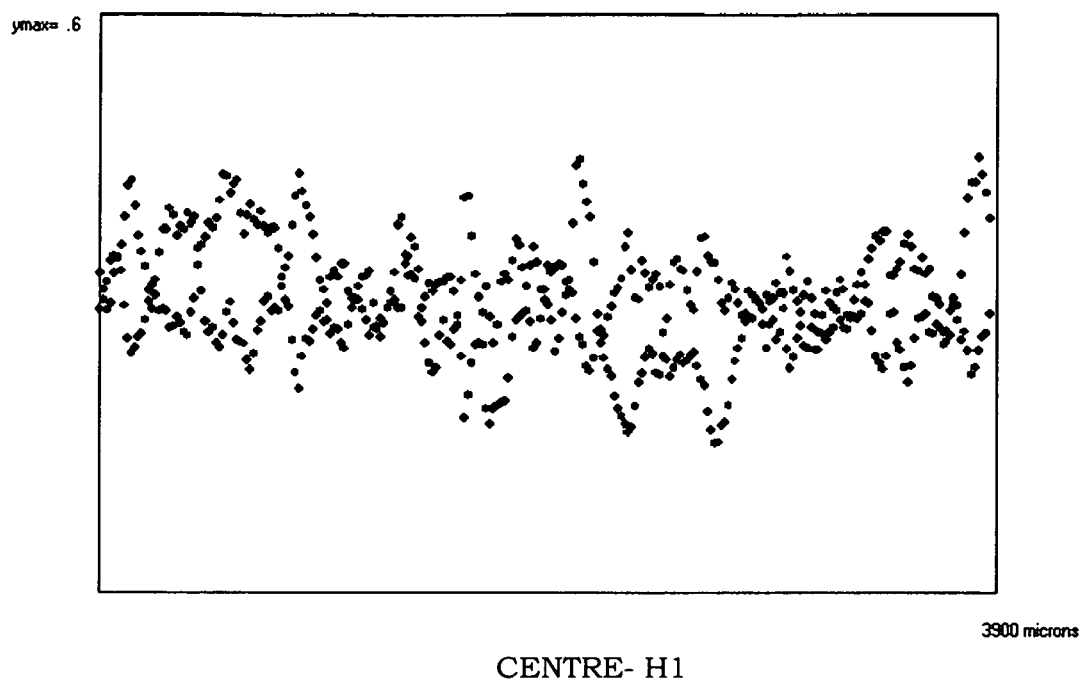
CENTRE- H1
FIGURE 8E – EXAMPLE 8, PLATE 1

REFRACTORY METAL PLATES

CROSS-REFERENCE TO RELATED APPLICATION

This application claims priority under 35 U.S.C. §119(e) to provisional application Ser. No. 60/963,616, filed Aug. 6, 2007, incorporated by reference herein in its entirety. This application is a continuation of U.S. application Ser. No. 12/221,646, filed on Aug. 5, 2008, now U.S. Pat. No. 9,095,885.

FIELD OF THE INVENTION

The present invention relates to plates of pure tantalum or other refractory metals with novel properties, and their utilization as sputtering targets.

BACKGROUND OF THE INVENTION

The crystallographic texture of a plate used as a sputtering target is of great importance to the sputtering performance, particularly to the uniformity of thickness of the thin films deposited on substrates. Only a plate with uniform texture throughout its volume will give optimum performance, and users rely on a steady supply of plates with similar texture. However, the manufacture of plates by existing, state-of-the-art, methods does not produce uniform texture.

A tantalum plate produced from an electron-beam-melted ingot by conventional processing (1980's technology), i.e. side-forging, rolling and annealing, has a banded texture, a legacy of the large grains formed during solidification. It also has a through-thickness texture gradient, caused by variation of the shear strain (through the thickness) induced during rolling. It may also show incomplete recrystallization, and grain-size banding.

Various advances and improvements in processing tantalum ingots have been published:

Pokross, in 'Controlling the Texture of Tantalum Plate', JOM October 1989, and Clark et al. in a series of 3 papers in Metallurgical Transactions A in 1991 and 1992 described the value of bi-directional rolling (also known as cross-rolling) and multiple anneals.

Michaluk et al., in U.S. Pat. Nos. 6,348,113 and 6,893,513, discloses methods of preparing tantalum plates that do not achieve high levels of uniformity.

Jepson et al, in U.S. patent application Ser. No. 10/079,286, discloses refractory metal plates having a reduction in texture banding severity achieved by introducing upset/forge-back/anneal sequences.

Turner, in U.S. Pat. No. 6,331,233, discloses a process for preparing tantalum plates which reduces banding severity, but which results in a rather strong through-thickness texture gradient.

Shah and Segal, in U.S. Pat. No. 6,348,139, disclose the use of a low-friction interfacial layer in upset forging to achieve a more uniform strain. The use of low-friction interfacial layers in upset forging of other materials has long been known (e.g., Morra and Jepson, Superalloys 718, 625, 706 Conference, 1997).

Field et al., "Microstructural Development in Asymmetric Processing of Tantalum Plate" in Journal of Electronic Materials, Vol 34, No 12, 2005, introduced the concept of asymmetric processing to achieve shear strain throughout the thickness of a plate.

Kumar et al., in U.S. Pat. No. 6,521,173, disclose the manufacture of metal powder suitable for consolidation into plates for sputtering. Although powder consolidated by hot isostatic pressing has a random, perfectly uniform texture, some texture, including a through-thickness texture gradient, develops when the block of consolidated powder is rolled to plate and annealed.

Koenigsmann and Gilman, in U.S. Pat. Nos. 6,770,154 and 7,081,148, disclose tantalum sputtering targets made by powder-metallurgy with particular proportions of various grain orientations and an absence of visible banding. Targets made in accordance with these patents but involving a rolling step would have a through-thickness texture gradient.

Advances have been made in measuring texture, and the measurements can be used in such a way that the uniformity of texture can be described quantitatively. The EBSD (electron back-scatter diffraction) technique measures texture grain-by-grain (whereas X-ray diffraction, the only technique available until the early 2000's, only measured an aggregate over the area irradiated, which covered many grains), and EBSD equipment which can cover the full thickness of the plate in a reasonable time is now available. Methods of quantifying texture uniformity were described both by Michaluk, in U.S. Pat. No. 6,348,113 and by Jepson in U.S. patent application Ser. No. 10/079,286, but both of these methods were rudimentary and unsatisfactory. Another method, somewhat improved, was described by Michaluk et al. in JOM, March 2002. Presently, an ASTM standard for quantification of texture is being drafted, following initiatives of Sutliff and Jepson (unpublished), and the proposed ASTM standard method will be used in the present application to describe the uniformity of texture.

Three factors must be calculated and used to give an overall view of the non-uniformity of texture within a plate:
a) Through-thickness gradient
b) Banding severity
c) Variation across a plate.

If the same measurements of texture are made for a multiplicity of plates made by the same process, the stability of the process from plate to plate can also be estimated.

The rate of sputtering from a grain in the target depends on the orientation of the crystal planes of that grain relative to the surface (ref. Zhang et al, "Effect of Grain Orientation on Tantalum Magnetron Sputtering Yield", J. Vac. Sci. Technol. A 24(4), July/August 2006). Also, certain crystallographic directions are preferred directions of flight of the sputtered atoms (ref. Wickersham et al, "Measurement of Angular Emission Trajectories for Magnetron-Sputtered Tantalum", Journal of Electronic Materials, Vol 34, No 12, 2005). The grains of a sputtering target are so small (typically 50-100 μm diameter) that the orientation of any individual grain has no significant effect. However, the texture of an area of the sputtered surface (an area roughly 5 cm to 10 cm diameter) can have a significant effect. Thus, if the texture of one area on the surface of a target is different from the texture of any other area, the thickness of the film produced is unlikely to be uniform over the whole substrate. Also, if the texture of a surface area is different from that of the same area at some depth into the target plate, the thickness of the film produced on a later substrate (after the target is used, or eroded, to that depth) is likely to be different from that produced on the first substrate.

So long as the texture of one area, then, is similar to that of any other, it is not important what that texture is. In other words, a target plate in which every grain has a 111 orientation parallel to the plate normal direction (ND) is no better and no worse than one in which every grain has a 100 orientation parallel to ND, or than one which consists of a mix of 100, 111 and other grains, so long as the proportions of the mix remain constant from area to area.

Uniformity of film thickness is of major importance. In integrated circuits, several hundred of which are created simultaneously on a silicon wafer, for example, too thin a film at one point will not provide an adequate diffusion barrier, and too thick a film at another point will block a via or trench, or, if in an area from which it should be removed in a later step, will not be removable. If the thickness of the film deposited is not within the range specified by the designer, the device will not be fit for service, and the total cost of manufacture up to the point of test is lost, since no repair or rework is normally possible.

If the target does not have uniform texture, and thus does not provide a predictable, uniform sputtering rate, it is impossible, in state-of-the-art sputtering equipment, to control the variation of thickness from one point on the substrate to another. Partial, but not total, control of variation of thickness from substrate to substrate, and from target to target, is possible using test-pieces. Use of test-pieces, however, is time-consuming and costly.

With targets made according to the prior art, the non-uniformity of texture found in the target plate caused unpredictability in the sputtering rate (defined as the average number of tantalum atoms sputtered off the target per impinging argon ion), or a change in the sputtering rate as the target was used. Variations of sputtering rate cause variation of the thickness of the film produced from point to point on the substrate, and also cause variation of average thickness of the film produced on the substrate from substrate to substrate, and from target to target.

SUMMARY OF THE INVENTION

Accordingly, the present invention will considerably improve the predictability, and the uniformity, of the thickness of the films produced, and thus improve the ease of use of the targets.

The present invention allows production of plates where the texture is substantially uniform throughout the volume of the plate. Also, the texture of one plate manufactured in accordance with the invention is substantially the same as that of any other plate manufactured by the same method.

Starting with conventional EB-melted ingots, the process of the present invention uses improved forging techniques and improved rolling techniques, such as those described in the U.S. patent application entitled "Methods of Controlling Texture of Plates and Sheets by Tilt Rolling" filed on even date herewith and incorporated by reference herein, to introduce sufficient redundant work into the material to annihilate the texture of the ingot, then to introduce a controlled texture. The particular sequence of forging, rolling and heat-treating produces a final microstructure with a uniformity of texture which has not been previously achieved.

Starting, alternatively, with metal powder, and using conventional methods of consolidating the powder, the process invented uses the same improved rolling techniques to produce a plate with improved uniformity of texture.

Accordingly, in one aspect the present invention provides a refractory metal plate having a center, a thickness, an edge, a top surface and a bottom surface, the refractory metal plate having a crystallographic texture (as characterized by through thickness gradient, banding severity; and variation across the plate, for each of the texture components 100//ND and 111//ND) which is substantially uniform throughout the plate.

In an additional aspect, the present invention provides a refractory metal plate manufactured by ingot metallurgy having a center, a thickness, an edge, a top surface and a bottom surface, the refractory metal plate having a crystallographic texture as characterized by through thickness gradient; banding severity; and variation across the plate, for the texture components 100//ND and 111//ND, where the average through-thickness gradient is less than or equal to 6% per mm, the average banding severity is less than or equal to 6%, and the average variation across the plate is less than or equal to 6%.

The present invention also provides a refractory metal plate manufactured by ingot metallurgy having a center, a thickness, an edge, a top surface and a bottom surface, the refractory metal plate having a crystallographic texture as characterized by through-thickness gradient; banding severity; and variation across the plate, for the texture components 100//ND and 111//ND, where the maximum through-thickness gradient is less than or equal to 13% per mm, the maximum banding severity is less than or equal to 8%, and the maximum variation across the plate is less than or equal to 11%.

In yet another aspect, the present invention provides a refractory metal plate manufactured by ingot metallurgy having a center, a thickness, an edge, a top surface and a bottom surface, having a texture as characterized by through-thickness gradient for the texture components 100//ND and 111//ND, where the average through-thickness gradient is less than or equal to 4% per mm.

Also provided is a refractory metal plate manufactured by ingot metallurgy having a center, a thickness, an edge, a top surface and a bottom surface, having a texture as characterized by through-thickness gradient, where the average through-thickness gradient for the texture component 111//ND is less than or equal to 2% per mm.

In an additional aspect, the invention provides a refractory metal plate manufactured by ingot metallurgy having a center, a thickness, an edge, a top surface and a bottom surface, having a texture as characterized by through-thickness gradient, where the maximum through-thickness gradient for the texture components 100//ND and 111//ND is less than or equal to 9% per mm.

In other aspects, the present invention provides a refractory metal plate manufactured by powder metallurgy having a center, a thickness, an edge, a top surface and a bottom surface, the refractory metal plate having a crystallographic texture as characterized by through-thickness gradient; banding severity; and variation across the plate, for the texture components 100//ND and 111//ND, where the average through-thickness gradient is less than or equal to 5% per mm, the average banding severity is less than or equal to 4%, and the average variation across the plate is less than or equal to 4%.

The present invention also provides a refractory metal plate manufactured by powder metallurgy having a center, a thickness, an edge, a top surface and a bottom surface, having a texture as characterized by through-thickness gradient, where the maximum through-thickness gradient for the texture components 100//ND and 111//ND is less than or equal to 3% per mm.

The present invention further relates to methods, such as a method of making a refractory metal plate, the method comprising the steps of:
 i) providing an EB-melted ingot;
 ii) cleaning the surface of the ingot;
 iii) cutting the ingot into lengths to provide workpieces;

iv) processing each workpiece with at least three cycles of upset-forge and forge-back;

v) annealing each workpiece at least three times, before or after an upset-forge/forge-back cycle, providing adequate strain for at least partial recrystallization in each cycle;

vi) cutting each workpiece into a size suitable for a target plate; vii) rolling each plate asymmetrically to the desired thickness; and viii) annealing after rolling, to achieve substantially full recrystallization.

In an additional aspect, the invention includes a method of rolling a metal plate, the method comprising the step of applying shear to the mid-thickness of the metal plate by means of tilted entry into the roll.

A further aspect of the invention includes a method of making a refractory metal plate, the method comprising the steps of:

i) providing a billet prepared by powder metallurgy methods;

ii) annealing the billet;

iii) cutting each billet into a size suitable for a target plate;

iv) rolling each plate asymmetrically to the desired thickness; and v) annealing after rolling, to achieve substantially full recrystallization.

The present invention also provides a refractory metal plate manufactured by ingot metallurgy having a center, a thickness, an edge, a top surface and a bottom surface, having a texture as characterized by through-thickness gradient for the texture components 100//ND and 111//ND, where the average through-thickness gradient is less than or equal to 4% per mm, and the texture of which is substantially the same as any other plate made by the same method.

And, the present invention provides a refractory metal plate manufactured by powder metallurgy having a center, a thickness, an edge, a top surface and a bottom surface, having a texture as characterized by through-thickness gradient, where the average through-thickness gradient for the texture components 100//ND and 111//ND is less than or equal to 2% per mm, and the texture of which is substantially the same as any other plate made by the same method These and other aspects of the present invention will become more readily apparent from the following drawings, detailed description and appended claims.

BRIEF DESCRIPTION OF THE DRAWINGS

The file of this patent contains at least one color photograph. Copies of this patent with color photographs will be provided by the Patent and Trademark Office upon request and payment of the necessary fee.

The invention is further illustrated by the following drawings in which:

FIGS. 1A, 1B and 1C are grain maps of tantalum plates in accordance with Example 1;

FIG. 1D is a graph of the results of measurements of the plate of Example 1;

FIGS. 2A, 2B and 2C are grain maps of a tantalum plate in accordance with Example 2;

FIG. 2D is a graph of the results of measurements of the plate of Example 2;

FIGS. 3A, 3B, 3C and 3D are grain maps of a tantalum plate in accordance with Example 3;

FIG. 3E is a graph of the results of measurements of the plate of Example 3;

FIGS. 4A and 4B are grain maps of a tantalum plate in accordance with Example 4;

FIG. 4C is a graph of the results of measurements of the plate of Example 4;

FIGS. 5A, 5B and 5C are grain maps of a tantalum plate in accordance with Example 5;

FIG. 5D is a graph of the results of measurements of the plate of Example 5;

FIGS. 6A, 6B and 6C are grain maps of a tantalum plate in accordance with Example 6; and FIG. 6D is a graph of the results of measurements of the plate of Example 6.

FIGS. 7A, 7B and 7C are grain maps of a tantalum plate in accordance with Example 7; and FIG. 7D is a graph of the results of measurements of the plate of Example 7.

FIGS. 8A, 8B, 8C and 8D are grain maps of a tantalum plate in accordance with Example 8; and FIG. 8E is a graph of the results of measurements of the plate of Example 8.

DETAILED DESCRIPTION OF THE INVENTION

As used herein in the specification and claims, including as used in the examples and unless otherwise expressly specified, all numbers may be read as if prefaced by the word "about", even if the term does not expressly appear. Also, any numerical range recited herein is intended to include all sub-ranges subsumed therein. All ranges include the endpoints cited.

A—Ingot Metallurgy

A conventional EB (electron beam)—melted ingot is used as the starting point. It may be of any purity commonly used for sputtering targets (typically, "3 nines 5" to "5 nines 5"). Preferably, the ingot is at least 99.95% pure, more preferably at least 99.995% pure. Purity, as used herein, refers to elimination of metallic impurities, not interstitial impurities. A conventional EB-melted ingot consists of a near-surface region of grains nucleated at the surface (approximately equiaxed, with about 1 cm size) and a central region of long grains, with the long axis parallel to the ingot axis. The crystallographic orientation of the grains is not controlled in any way.

In one embodiment, the present invention provides a method of making a refractory metal plate having a center, a thickness, an edge, a top surface and a bottom surface, the method comprising the steps of:

i) providing an EB-melted ingot;

ii) cleaning the surface of the ingot;

iii) cutting the ingot into lengths to provide workpieces;

iv) processing each workpiece with at least three cycles of upset-forge and forge-back;

v) annealing each workpiece at least three times, before or after an upset-forge/forge-back cycle, to provide adequate strain for at least partial recrystallization with each cycle;

vi) cutting each workpiece into a size suitable for a target plate;

vii) rolling each plate asymmetrically to the desired thickness; and viii) annealing after rolling, to achieve substantially full recrystallization.

Substantially full "recrystallization", as used herein, is a term of art, known to those skilled in the art of metallurgy, and refers to a plate having at least 85%, 90%, 95%, 96%, 97%, 98%, 99%, 99.5%, or higher recrystallization. Typically, the amount of recrystallization is determined after the final annealing step, when a sample is taken from the edge of the plate and examined microscopically.

In one embodiment, the refractory metal plate is further processed with one or more processing steps selected from the group consisting of cleaning the surface before each annealing, upset forge to cheese, flattening, and cutting to size after rolling.

For example, the ingot can be processed in accordance with one embodiment of the method for ingot-processing as described in U.S. patent application Ser. No. 10/079,286 (para 29), incorporated herein by reference. Specifically, the operations are:

1) Clean the surface of the ingot by machining.
2) Cut the ingot into lengths
3) Upset forge (U1)
4) Anneal (A1)
5) Forge-back to approximately the original dimensions (FB1)
6) Upset forge (U2)
7) Forge-back to approximately the original dimensions (FB2)
8) Anneal (A2)

Subsequently, the operations diverge from the cited embodiment of U.S. Ser. No. 10/079,286. An example of a sequence of operations in an embodiment of the present invention is the following:

9) Upset forge (U3)
10) Forge-back to a diameter less than the original diameter (FB3)
11) Anneal (A3)
12) Forge-back further (FB4)
13) Clean the surface by machining
14) Cut the billet into lengths, each piece being of the required weight to make one target plate
15) Upset forge to cheese (UC)
16) Roll to the desired thickness.
17) Anneal (A4)
18) Flatten
19) Cut to size.

In general, the anneals can be placed wherever desired; it is not required to have an anneal following each upset/forge-back sequence. The positions of the anneals are arranged so that (a) there is enough strain put in throughout the volume to cause substantially complete recrystallization during the anneal, but (b) there is not so much strain that either the material becomes so strong that the forging press runs out of strength or the workpiece begins to crack. Preferably, annealing is done as soon as possible after the true strain in the least-strained part of the volume reaches a value of 1. However, the first anneal is preferably done at lower strain because the workpiece at this stage is more susceptible to cracking.

Operations 9, 10, 11, 12 and 13 are performed in the same manner as similar operations described in U.S. application Ser. No. 10/079,286.

Operations 2 through 11 constitute three "strain-and-anneal" cycles. The dimensions of the individual workpieces before and after each operation are arranged such that the strain in every element of the volume of the workpiece in each cycle is at least about 1, as a rule of thumb, and such that that strain is composed of comparable strain components in the 3 orthogonal "principal-strain" directions.

Operation 12 is optional. It is used for small sputtering-target plates (for example, those used to sputter 200 mm silicon wafers), but not for large plates (for example, those used to sputter 300 mm silicon wafers).

Operation 14 is carried out on a band-saw or any similar suitable cutting equipment.

Operation 15 is carried out with a low-friction layer between top die and workpiece, and between bottom die and workpiece. A plate of aluminum (such as Al alloy 1100, in a soft temper), ¼" thick, has been found to be suitable; other metals and metal alloys can also be used.

Operation 15 is optional. It is used for thick sputtering-target plates (those greater than about 0.300" thickness), but not for thinner ones.

Operation 16 is done on a conventional rolling mill (for example, a horizontal reversing 4-high single-stand mill with 16" diameter rolls), but under special conditions, such as those described in the U.S. patent application entitled "Methods of Controlling Texture of Plates and Sheets by Tilt Rolling" filed on even date herewith, incorporated by reference herein, also described in more detail below.

Operations 17, 18 and 19 may be done in any order. They are all carried out in a conventional manner.

After Operation 19, the plate is bonded to a backing plate, machined to finish, and cleaned, to form a finished planar sputtering target. Any accepted method may be used for these operations. The sputtering target is subsequently sputtered, for example with a DC magnetron sputtering process, to form a thin film of tantalum on a substrate such as a silicon wafer. Although the advantages of this invention will be less noticeable with older generations of sputtering equipment, because non-uniformity due to target variation might be small compared to non-uniformity due to other causes, modern sputtering equipment, particularly that designed to produce integrated circuits with a 65 nm or smaller design rule, will especially benefit from this invention.

B—Powder Metallurgy

The powder is manufactured and processed in accordance with the method described in U.S. Pat. No. 6,521,173, forming a cylindrical billet.

Specifically, the operations are:

1) Cold Isostatically Press (CIP) the powder to 60-90% density;
2) Encapsulate the pressed preform in a steel can and evacuate and seal the can;
3) Hot Isostatically Press (HIP) the preform to a billet with 100% density;
4) Remove the steel can;
5) Anneal the billet; and
6) Cut, using a band-saw or any similar suitable cutting equipment, into slices suitable for rolling into a plate: the slices have the shape of a hockey puck.

The puck is rolled exactly in accordance with the rolling described above for Ingot-Metallurgy (Operation 16).

After rolling, the plate is processed and treated exactly as described above for Ingot-Metallurgy (Operations 17, 18 and 19, bonding to a backing plate, etc.).

Refractory metal plates made by the above methods, where ingot derived, will have an average through-thickness gradient of less than or equal to 6% per mm, more preferably less than 4%, most preferably less than 3%, for the texture components 100//ND and 111//ND.

The maximum through-thickness gradient of ingot derived plates will be less than or equal to 13% per mm, more preferably less than 9%, most preferably less than 8% for the texture components 100//ND and 111//ND.

Ingot derived plates will have an average banding severity of less than or equal to 6%, and the maximum banding severity is less than or equal to 8%, for the texture components 100//ND and 111//ND.

Ingot derived plates will have an average variation across the plate of less than or equal to 6%, more preferably less than or equal to 5%, for the texture components 100//ND and 111//ND.

The maximum variation across the plate for ingot derived plates is less than or equal to 11%, more preferably less than 7%, for the texture components 100//ND and 111//ND.

In one embodiment, ingot derived refractory metal plates of the invention will have an average through-thickness gradient for the texture component 111//ND less than or equal to 2% per mm.

Refractory metal plates made by the above methods, where made by powder metallurgy methods (powder met), will have an average through-thickness gradient of less than or equal to 5% per mm, more preferably less than 2%, for the texture components 100//ND and 111//ND.

The maximum through-thickness gradient of powder met plates is less than or equal to 8% per mm, more preferably less than 3%, for the texture components 100//ND and 111//ND.

Powder met plates will have an average banding severity of less than or equal to 5%, more preferably less than 4%, for the texture components 100//ND and 111//ND.

The maximum banding severity of powder met plates is less than or equal to 7%, more preferably less than or equal to 5%, for the texture components 100//ND and 111//ND.

Powder met plates will have an average variation across a plate less than or equal to 4%, and a maximum variation across a plate of less than or equal to 7%, for the texture components 100//ND and 111//ND.

For measurements of through-thickness gradient, such as average and maximum gradient, and variations across the plate or from plate to plate, the lower bound is 0%, i.e., it may in some cases be possible to achieve zero variation or gradient. For measurements of banding, the lower bound is about 2%; levels lower than this are difficult to achieve or detect due to the noise in measurement of this property.

Some advantages of the methods of the present invention may be achieved by 1) the use of at least three cycles of upset-and-forge-back to break up the ingot grain structure and homogenize the texture, 2) the use of aluminum or other metal plates to improve (make more homogeneous) the strain distribution in cheese upset, 3) the use of an inclined plane to feed the workpiece into the rolling mill, and 4) control of rolling so that the curl is controlled, and similar from pass to pass and from workpiece to workpiece. Although control of curl for the purpose of easing subsequent operations is practiced routinely, control of curl for the purpose of minimizing variation of texture from workpiece to workpiece is novel.

The use of an inclined plane is referred herein as "tilt rolling" or "tilted entry". It makes the rolling process asymmetric as compared to standard rolling processes, which are symmetric, in that there is a plane of symmetry corresponding to the mid-thickness plane of the workpiece. Asymmetric rolling is sometimes used, for example, when rolling aluminum sheet, to improve the result of a subsequent deep-drawing operation (for example, "Development of Grain Structure and Texture during Annealing in Asymmetrically-Rolled AA5754", H. Jin and D. J. Lloyd, Materials Science Forum Vols 467-470 (2004), p. 381). Asymmetric rolling to improve the sputtering performance of a tantalum plate was introduced by Field et al. in 2005 (as referenced in Background), but asymmetry was introduced in one of the following ways:

1) Use of rolls (top and bottom work rolls) rotating at different speeds
2) Use of rolls (top and bottom work rolls) of different diameters
3) Use of rolls (top and bottom work rolls) with different friction coefficients.

Accordingly, in the methods of the present invention, the term "asymmetric rolling" will refer to tilted entry or tilt rolling. Rolling will be carried out according to the present invention using an angle of incline of between 2% and 20%, more preferably an angle of incline of at between 3 and 7%. As would be understood by one skilled in the art, typically the angle will be above horizontal, i.e. the sheet or plate is fed downward into the roll. In some cases, however, such as in multi-stand rolling, the angle may be below horizontal, and the plate or sheet is fed upward into the roll. As used herein, the term "angle of incline" refers to both modes of feeding the plate/sheet into the roll.

Compared to all other tantalum plates currently available, and compared to all other claims of texture uniformity of ingot-derived tantalum plate published as papers or patent documents, the product made by the process of the present invention has more uniform texture, substantially completely uniform, as measured in accordance with the draft ASTM Standard Method, and reported as Through-Thickness Gradient, Banding Severity, Variation Across a Plate, and Variation from Plate to Plate. Substantially uniform texture means, in this context, only slight variations in texture, at the limits of detection using the best available methods, for example, a through-thickness gradient of no greater than 3% per mm, a banding severity no greater than 5%, and a variation across the plate no greater than 6%, due to the imperfect precision of measurement.

In particular, the Through-Thickness Gradient is reduced, compared to the prior art, while Banding Severity and Variation Across a Plate and Variation from Plate to Plate are at least as good as the prior art.

"Substantially the same", in the context of variation from plate to plate, means that if the texture of each of a large number of plates is quantified by the 6 parameters shown in Table 10 (below), and the standard deviation of the population of each parameter is less than 4, all the plates in that population are said to have substantially the same texture.

The grain size of the plates is not compromised by the special processing needed to obtain uniform texture. An average grain size (linear intercept) of less than 80 μm is normally achieved, and in some embodiments is less than 60 μm.

In some embodiments, during rolling the workpiece is rotated a pre-determined angle about a vertical axis between passes. In this context, "pre-determined" means that an angle is chosen and used for every rotation.

In some embodiments, the thickness reduction per pass is pre-determined. In other embodiments, the workpiece is turned over at regular intervals. In yet additional embodiments, a lubricant is applied to the top and bottom surfaces of the workpiece and the rolls are maintained at a constant roughness.

Variation from plate to plate can be minimized by using the same parameters for rotation, thickness reduction, turning over, lubrication and roughness.

Powder-metallurgy processing has the advantage (over ingot-metallurgy processing) of producing, in general, more uniform texture. However, it has certain disadvantages, including higher impurity content. Powder-metallurgy plates made according to the present invention have a lower through-thickness texture gradient than any previous powder-metallurgy plate.

The sputtering performance of targets made from this plate will be more predictable, and more consistent as a target is used (i.e. from beginning of life to end of life), and more consistent from target to target, than targets made according to the prior art.

EXAMPLES

The invention is further illustrated by the following examples, which are not meant to be limiting.

Example 1 (Comparative)

A plate was produced in accordance with U.S. patent application Ser. No. 10/079,286, paragraphs 26, 28 and 29. A total of 3 annealings (2 intermediate, 1 final) were carried out.

Samples were taken from the centre of the plate, the mid-radius of the plate and the edge of the plate, and the texture determined by EBSD, using a 15 µm step in both horizontal and vertical directions. The plate was 6 mm thick. The average grain size was about ASTM 6 (40 microns Average Linear Intercept (ALI) distance). The results are presented here in various ways.

First, grain maps of the full thickness of samples from the three locations are shown in FIGS. 1A, 1B and 1C. The top edge of the map is one rolled surface, and the bottom edge is the other rolled surface. Note that the plate, as-rolled, was slightly thicker in the centre than at the edge. The width examined (the horizontal length of each map) is 1.5 mm. The maps show the grains which have particular crystallographic directions within 15° of the plate Normal Direction (the vertical direction on the maps). Grains with 100 within 15° of ND (known as the 100//ND component) are red, those with 111 within 15° of ND (the 111//ND component) are blue, and those with 110 within 15° of ND are yellow. Grains which satisfy none of the criteria are grey. The percentages of area occupied by these color blocks form the basis of calculation of the numerical factors addressed below.

Second, the maps are analyzed mathematically as follows:
1) The maps are divided into two halves, the top half (H1) and bottom half (H2).
2) A mask, with a cut-out hole 135 µm high, but full-width (1.5 mm in this case), is placed over the map, such that the top of the cut-out hole corresponds to the top of the map. Note that the height of the window (in this case 135 µm) is chosen to be approximately 3 grains, but an integral number of EBSD steps (in this case, 9 steps).
3) The percentage of the area of the cut-out hole occupied by red color is calculated, as is the percentage occupied by blue color.
4) The mask is moved down by one step (in this case 15 µm), and the calculations repeated.
5) Operation 4 is repeated until the bottom of the cut-out hole corresponds to the bottom of the map.
6) A graph (FIG. 1D) is made showing the results. For example, this graph is for the top half of the centre sample. The Y axis shows the area percentage, from 0% to 70%, while the X axis shows the position of the mask cut-out, from the top of the map (left side) to mid-thickness (right side). The red dots refer to 100, while the blue dots refer to 111.

7) This data is analyzed to determine, for each half of the thickness:
 a) The gradient of the best-fit straight line through the 100 data, expressed as % per mm (100 Grad).
 b) The gradient of the best-fit straight line through the 111 data, expressed as % per mm (111 Grad).
 c) The average distance (in the y-direction) of each 100 data-point from the best-fit straight line, (which, if it would go below zero, is counted as zero), expressed as % (100 BF)
 d) The average distance (in the y-direction) of each 111 data-point from the best-fit straight line (which, if it would go below zero, is counted as zero), expressed as % (111 BF).

The results of this analysis, for both half-thicknesses of the three specimens, are:

TABLE 1A

|  | 100Grad | 111Grad | 100BF | 111BF |
|---|---|---|---|---|
| Centre H1 | −4.06 | 4.93 | 8.40 | 6.63 |
| Centre H2 | 0.70 | 2.04 | 6.86 | 9.10 |
| Mid-Rad H1 | −9.55 | 14.45 | 5.05 | 4.95 |
| Mid-Rad H2 | 4.80 | −0.61 | 6.55 | 8.54 |
| Edge H1 | −8.33 | 13.94 | 6.66 | 7.61 |
| Edge H2 | 6.22 | −7.74 | 9.23 | 7.47 |

8) Finally, the variation across a plate is calculated. This calculation is not included in the draft ASTM Standard Method. It is best evaluated from the following table, which shows the area percentage of 100 and 111 within 15° of ND for each half-thickness of each sample. The range is the difference between greatest and smallest numbers in the row. Note that the mask with a cut-out is not used in this calculation.

TABLE 1B

|  | Centre | Mid-Rad | Edge | A/P Range |
|---|---|---|---|---|
| H1-100 | 38 | 39 | 28 | 11 |
| H1-111 | 22 | 27 | 30 | 8 |
| H2-100 | 39 | 34 | 27 | 12 |
| H2-111 | 22 | 35 | 44 | 22 |

'100 Grad' and '111 Grad' are measures of the through-thickness gradient.

'100BF' and '111BF' are measures of the banding severity.

A/P Range' is a measure of the variation of the texture across a plate.

Example 2 (Comparative)

A plate was produced in accordance with U.S. Pat. No. 6,331,233, 'Detailed Description' and FIG. 3. The average grain size was about ASTM 5 (60 microns ALI).

Samples were taken from the centre of the plate, the mid-radius of the plate and the edge of the plate, and the texture determined by EBSD, using a 15 µm step in both horizontal and vertical directions. The plate was 9 mm thick, and the width examined was 3.6 mm. A window height of 180 µm was used. The results are presented in the same manner as Example 1 (except the graph shows area percentage from 0% to 90% rather than 0% to 70%) in FIGS. 2A, 2B, 2C and 2D, and in Tables 2A and 2B.

TABLE 2A

|  | 100 Grad | 111 Grad | 100BF | 111BF |
|---|---|---|---|---|
| Centre H1 | −4.40 | 12.47 | 7.38 | 7.93 |
| Centre H2 | 2.26 | −10.18 | 6.78 | 6.39 |
| Mid-Rad H1 | −7.11 | 13.29 | 5.25 | 5.83 |
| Mid-Rad H2 | 9.69 | −12.00 | 4.85 | 6.78 |
| Edge H1 | −8.24 | 6.39 | 4.86 | 4.77 |
| Edge H2 | 6.65 | −5.23 | 5.00 | 5.12 |

TABLE 2B

|  | Centre | Mid-Rad | Edge | A/P Range |
|---|---|---|---|---|
| H1-100 | 20.9 | 19.3 | 27.4 | 8.1 |
| H1-111 | 26.5 | 27.0 | 22.1 | 4.9 |
| H2-100 | 16.2 | 21.4 | 22.8 | 6.6 |
| H2-111 | 25.5 | 28.0 | 21.9 | 6.1 |

Example 3 (Comparative)

Three plates 7 to 8 mm thick were produced by a powder-metallurgy process in accordance with U.S. Pat. No. 6,521,173 and the process given above (steps 1 to 6), resulting in pucks 165 mm diameter and 81 mm thick. The pucks were rolled using conventional techniques (including an annealing step at 33 mm thickness), and finish-processed conventionally.

Samples were taken from the centre of each plate, the mid-radius of each plate and the edge of each plate (2 samples, well separated), and the texture determined by EBSD, using a 10 μm step in both horizontal and vertical directions. The results are presented in Tables 3A and 3B in the same way as for Example 1, except that the width examined was 1.64 mm rather than 1.5 mm, and the graph shows area percentage from 0% to 60% rather than 0% to 70%. Grain maps of Plate 1 are presented in FIGS. 3A, 3B, 3C and 3D, with results of Centre—H1 displayed in FIG. 3E. The average grain size was about ASTM 7 (28 microns ALI).

TABLE 3A

|  | 100 Grad | 111 Grad | 100 BF | 111 BF |
|---|---|---|---|---|
| Plate 1 |  |  |  |  |
| Centre H1 | −4.09 | 1.71 | 4.58 | 5.56 |
| Centre H2 | 1.93 | −3.10 | 5.44 | 5.56 |
| Mid-Rad H1 | −5.95 | 4.0 | 4.61 | 4.40 |
| Mid-Rad H2 | 4.28 | −3.89 | 5.22 | 4.63 |
| Edge 1 H1 | −3.28 | 6.32 | 4.39 | 4.84 |
| Edge 1 H2 | 5.19 | −2.48 | 4.50 | 5.32 |
| Edge 2 H1 | −5.64 | 4.70 | 3.63 | 4.68 |
| Edge 2 H2 | 7.94 | −4.47 | 4.34 | 5.45 |
| Plate 2 |  |  |  |  |
| Centre H1 | −6.34 | 4.96 | 5.96 | 5.44 |
| Centre H2 | 4.55 | −6.92 | 5.24 | 5.48 |
| Mid-Rad H1 | −6.48 | 7.97 | 5.79 | 5.51 |
| Mid-Rad H2 | 5.54 | −9.04 | 3.73 | 5.29 |
| Edge 1 H1 | −6.50 | 8.00 | 5.13 | 5.99 |
| Edge 1 H2 | 6.36 | −7.48 | 4.90 | 6.57 |
| Edge 2 H1 | −7.57 | 8.48 | 5.09 | 7.32 |
| Edge 2 H2 | −7.61 | 8.79 | 4.04 | 7.06 |
| Plate 3 |  |  |  |  |
| Centre H1 | −5.20 | 4.97 | 4.65 | 7.08 |
| Centre H2 | 4.38 | −2.14 | 4.29 | 6.74 |
| Mid-Rad H1 | −8.36 | 5.76 | 5.58 | 6.67 |
| Mid-Rad H2 | 5.96 | −6.74 | 4.77 | 7.86 |

TABLE 3A-continued

|  | 100 Grad | 111 Grad | 100 BF | 111 BF |
|---|---|---|---|---|
| Edge 1 H1 | −4.93 | 5.60 | 3.57 | 5.35 |
| Edge 1 H2 | 4.89 | −4.46 | 4.53 | 5.16 |
| Edge 2 H1 | −5.07 | 3.91 | 4.11 | 6.05 |
| Edge 2 H2 | 7.80 | −7.46 | 4.91 | 4.84 |

TABLE 3B

|  | Centre | Mid-Rad | Edge 1 | Edge 2 | A/P Range |
|---|---|---|---|---|---|
| Plate 1 |  |  |  |  |  |
| H1 -100 | 23.7 | 27.8 | 23.2 | 22.7 | 5.1 |
| H1 - 111 | 25.2 | 22.3 | 28.2 | 29.9 | 7.6 |
| H2 - 100 | 27.1 | 26.3 | 27.3 | 26.0 | 1.3 |
| H2 - 111 | 21.5 | 25.4 | 29.2 | 29.8 | 8.3 |
| Plate 2 |  |  |  |  |  |
| H1 -100 | 26.5 | 26.2 | 26.8 | 22.9 | 3.9 |
| H1 - 111 | 28.5 | 30.2 | 29.8 | 31.8 | 3.3 |
| H2 - 100 | 23.8 | 20.9 | 23.5 | 21.7 | 2.9 |
| H2 - 111 | 29.0 | 30.2 | 33.1 | 27.3 | 5.8 |
| Plate 3 |  |  |  |  |  |
| H1 -100 | 23.4 | 24.8 | 23.2 | 21.4 | 3.4 |
| H1 - 111 | 30.5 | 35.1 | 31.4 | 34.4 | 4.6 |
| H2 - 100 | 27.1 | 22.0 | 27.0 | 26.0 | 5.1 |
| H2 - 111 | 31.7 | 35.2 | 29.9 | 30.9 | 5.3 |

Example 4 (Comparative)

Nineteen plates were produced in accordance with U.S. patent application Ser. No. 10/079,286, paragraphs 26, 28 and 29, but differing from Example 1 in that a total of 4 annealings (3 intermediate, 1 final) were carried out. The plates were about 10 mm thick.

One sample was taken from the edge of each plate. The texture of each sample was determined by EBSD, using a 15 μm step in both horizontal and vertical directions. The results are presented in FIGS. 4A, 4B and 4C, and in Table 4A, in the same way as Example 1, except that because only edge samples were taken, no A/P range can be calculated. The average grain size was about ASTM 5 (53 μm ALI).

TABLE 4A

|  | 100 Grad | 111 Grad | 100 BF | 111 BF |
|---|---|---|---|---|
| 1 - H1 | −8.17 | 9.66 | 7.01 | 7.68 |
| 1 - H2 | 4.28 | −8.70 | 5.16 | 7.63 |
| 2 - H1 | −3.22 | 2.93 | 7.47 | 8.43 |
| 2 - H2 | 1.76 | −6.99 | 5.33 | 9.09 |
| 3 - H1 | −4.48 | 11.24 | 2.96 | 7.40 |
| 3 - H2 | 6.06 | −7.92 | 4.04 | 8.88 |
| 4 - H1 | −5.23 | 3.43 | 4.46 | 5.87 |
| 4 - H2 | 6.88 | −9.12 | 5.87 | 6.63 |
| 5 - H1 | −7.35 | 8.89 | 4.46 | 7.33 |
| 5 - H2 | 8.22 | −10.00 | 4.68 | 8.94 |
| 6 - H1 | −5.69 | 9.73 | 3.38 | 7.96 |
| 6 - H2 | 4.89 | −8.88 | 3.28 | 4.55 |
| 7 - H1 | −5.90 | 4.07 | 3.67 | 4.17 |
| 7 - H2 | 4.91 | −4.29 | 3.83 | 7.37 |
| 8 - H1 | −4.38 | 4.28 | 5.39 | 4.69 |
| 8 - H2 | 6.81 | −9.14 | 4.58 | 6.81 |
| 9 - H1 | −4.42 | 8.24 | 3.78 | 5.98 |
| 9 - H2 | 8.55 | −11.81 | 5.60 | 5.79 |
| 10 - H1 | −4.15 | 9.15 | 7.33 | 8.11 |
| 10 - H2 | 5.12 | −6.89 | 7.37 | 10.58 |
| 11 - H1 | −4.96 | 9.04 | 6.80 | 8.35 |
| 11 - H2 | 4.00 | −7.20 | 4.27 | 6.93 |
| 12 - H1 | −6.71 | 10.51 | 3.53 | 12.23 |

TABLE 4A-continued

|  | 100 Grad | 111 Grad | 100 BF | 111 BF |
|---|---|---|---|---|
| 12 - H2 | 5.41 | −15.09 | 3.11 | 9.98 |
| 13 - H1 | −4.10 | 7.45 | 4.28 | 6.80 |
| 13 - H2 | 7.15 | −6.80 | 7.39 | 6.04 |
| 14 - H1 | −4.23 | 8.69 | 4.25 | 7.11 |
| 14 - H2 | 4.15 | −6.75 | 5.52 | 6.64 |
| 15 - H1 | −9.43 | 13.33 | 4.70 | 8.10 |
| 15 - H2 | 4.51 | −8.42 | 6.72 | 9.68 |
| 16 - H1 | −5.34 | 9.23 | 5.33 | 8.58 |
| 16 - H2 | 4.19 | −8.71 | 3.30 | 6.43 |
| 17 - H1 | −4.20 | 5.59 | 4.54 | 8.16 |
| 17 - H2 | 5.97 | −10.32 | 4.63 | 7.23 |
| 18 - H1 | −4.73 | 11.56 | 2.39 | 7.43 |
| 18 - H2 | 3.46 | −11.78 | 3.52 | 4.43 |
| 19 - H1 | −5.38 | 11.46 | 2.95 | 11.00 |
| 19 - H2 | 5.48 | −13.41 | 3.76 | 5.18 |

Example 5 (Inventive)

A plate 6 mm thick was made, using the ingot-metallurgy process outlined above, including the following process details:

1) Clean the surface of the ingot by machining. Cut the ingot (195 mm diameter) to length, 374 mm, resulting in a weight of 474 lbs.
2) Upset forge (U1) the billet to 65% of initial billet length
3) Anneal (A1) billet at 1370 C
4) Forge-back billet to 197 mm diameter (FB1)
5) Upset forge (U2) billet to 65% of initial billet length
6) Forge-back billet to 197 mm diameter (FB2)
7) Upset forge (U3) billet to 65% of initial billet length
8) Anneal (A2) billet at 1065 C
9) Forge-back the billet to 133 mm diameter (FB3). Clean the surface by machining, thus reducing the billet diameter to 127 mm
10) Cut the billet to length, 38.1 mm
11) Anneal (A3) billet at 1065 C
12) Roll to thickness. A 10-degree tilt angle was used. The thickness of the piece was reduced by approximately 5% in each pass. The piece was rotated 90 degrees about a vertical axis after each pass. The piece was turned over after every 4 passes. The final thickness of the piece after rolling was 6 mm.
13) Anneal (A4) at 1065 C
14) Flatten
15) Samples were taken from the centre of the plate, the mid-radius of the plate and the edge of the plate, and the texture determined by EBSD, using a 15 μm step in both horizontal and vertical directions. The results are presented here in the same way as for the Example 1, except that the width examined was 1.64 mm rather than 1.5 mm, and the graph shows area percentage from 0% to 60% rather than 0% to 70%. Grain maps and graphical results are shown in FIGS. 5A, 5B, 5C and 5D, respectively. The average grain size was about ASTM 6 (approximately 40 μm ALI).

TABLE 5A

|  | 100 Grad | 111 Grad | 100 BF | 111 BF |
|---|---|---|---|---|
| Centre H1 | −2.00 | −0.21 | 6.14 | 5.84 |
| Centre H2 | −2.24 | −2.59 | 5.86 | 3.52 |
| Mid-Rad H1 | −1.83 | −0.41 | 6.69 | 7.77 |
| Mid-Rad H2 | 2.51 | −8.49 | 5.60 | 5.20 |
| Edge H1 | −3.29 | 3.98 | 7.78 | 4.59 |
| Edge H2 | 3.08 | −3.69 | 5.43 | 7.63 |

TABLE 5B

|  | Centre | Mid-Rad | Edge | A/P Range |
|---|---|---|---|---|
| H1 - 100 | 27 | 28 | 32 | 5 |
| H1-111 | 26 | 26 | 28 | 2 |
| H2-100 | 30 | 35 | 37 | 7 |
| H2-111 | 22 | 22 | 23 | 1 |

Use of Other Measurement Procedures

The Centre sample of the plate made in Example 5 (as an example of the invention) is analyzed in the manners previously used and mentioned above.

Using the method described in U.S. Pat. No. 6,348,113, viz.:

The thickness was divided into 20 increments. For each increment, the peak intensity was calculated using a 10° half-width (which is not specified in '113, but is standard in the industry).

TABLE 5C

| Increment | 111 | 100 | ln (ratio) |
|---|---|---|---|
| 1 | 3.95 | 7.43 | −0.63 |
| 2 | 5.07 | 4.50 | 0.12 |
| 3 | 3.55 | 3.58 | −0.01 |
| 4 | 2.07 | 3.98 | −0.65 |
| 5 | 2.25 | 2.35 | −0.04 |
| 6 | 2.26 | 3.29 | −0.38 |
| 7 | 2.94 | 3.12 | −0.06 |
| 8 | 2.59 | 3.27 | −0.23 |
| 9 | 2.43 | 5.29 | −0.78 |
| 10 | 4.53 | 4.71 | −0.04 |
| 11 | 4.10 | 6.22 | −0.42 |
| 12 | 2.54 | 6.34 | −0.91 |
| 13 | 2.45 | 4.75 | −0.66 |
| 14 | 3.24 | 3.65 | −0.12 |
| 15 | 2.65 | 4.70 | −0.57 |
| 16 | 1.83 | 3.25 | −0.57 |
| 17 | 2.40 | 3.71 | −0.44 |
| 18 | 1.55 | 4.63 | −1.09 |
| 19 | 3.20 | 5.38 | −0.52 |
| 20 | 3.55 | 6.18 | −0.55 |

The 111 peak intensity varies from 1.55 to 5.07, whereas the 111 peak intensity in Plate 125B (one of the best examples in '113) varies from 0.85 to 6.06. The 100 peak intensity varies from 2.35 to 7.43, whereas the 100 peak intensity in Plate 125B varies from 0.27 to 10.65. The ln (111/100) varies from −1.09 to 0.12, whereas the ln (111/100) in Plate 125B varies from −2.53 to 3.11.

Thus, by the method of quantifying texture described in '113, the inventive example is much more uniform through the thickness than even the best example in '113. However, this method is not a good method of comparison, compared to the ASTM draft method used above.

Using the method described in U.S. patent application Ser. No. 10/079,286, viz:

The thickness was divided into 8 increments. The number of increments is not specified in '286, but 8 is typical, and the number of increments is not critical. For each increment, the % of the area within 15° of 100, and within 15° of 111, is calculated, and the difference (the distribution) is further calculated.

TABLE 5D

| Increment # | 100-15 | 111-15 | Difference |
|---|---|---|---|
| 1 | 34 | 31 | 3 |
| 2 | 23 | 20 | 3 |

TABLE 5D-continued

| Increment # | 100-15 | 111-15 | Difference |
|---|---|---|---|
| 3 | 22 | 23 | 1 |
| 4 | 29 | 32 | 3 |
| 5 | 36 | 28 | 8 |
| 6 | 29 | 22 | 7 |
| 7 | 23 | 18 | 5 |
| 8 | 32 | 22 | 10 |

The minimum difference is 1% and the maximum difference is 10%, resulting in a distribution of 9%. Thus it can be seen that the distribution of texture of the inventive example, 9%, is much less than the distribution achieved previously, as U.S. patent application Ser. No. 10/079,286 claimed a distribution of less than 30%, and plates made according to that process typically achieved a distribution of 25%. However, this method of comparison is not a good method, compared to the ASTM draft method used above.

Example 6 (Inventive)

A plate 7.5 mm thick was made, using the ingot-metallurgy process outlined above, including the following process details:
1) Clean the surface of the ingot by machining. Cut the ingot (195 mm diameter) to length, 374 mm, resulting in a weight of 474 lbs.
2) Upset forge (U1) the billet to 65% of initial billet length
3) Anneal (A1) billet at 1370° C.
4) Forge-back billet to 197 mm diameter (FB1)
5) Upset forge (U2) billet to 65% of initial billet length
6) Forge-back billet to 197 mm diameter (FB2)
7) Upset forge (U3) billet to 65% of initial billet length
8) Anneal (A2) billet at 1065° C.
9) Forge-back the billet to 133 mm diameter (FB3). Clean the surface by machining, thus reducing the billet diameter to 127 mm
10) Cut the billet to length, 63.5 mm
11) Anneal (A3) billet at 1065° C.
12) Roll to thickness. A 5-degree tilt angle was used. The thickness of the piece was reduced by approximately 5-10% in each pass. The piece was rotated 45 degrees about a vertical axis after each pass. The piece was turned over after every 4 passes. The final thickness of the piece after rolling was 7.5 mm.
13) Anneal (A4) at 1010° C.
14) Flatten
15) Samples were taken from the centre of the plate, the mid-radius of the plate and the edge of the plate, and the texture determined by EBSD, using a 15 μm step in both horizontal and vertical directions. The results are presented here in FIGS. 6A, 6B, 6C, and 6D and Tables 6A and 6B in the same way as for Example 1, except that the width examined was 1.80 mm rather than 1.5 mm. The average grain size was about ASTM 6 (approximately 40 μm ALI).

TABLE 6A

|  | 100 Grad | 111 Grad | 100 BF | 111 BF |
|---|---|---|---|---|
| Centre H1 | −5.82 | 3.12 | 5.05 | 6.25 |
| Centre H2 | 5.62 | −1.70 | 4.73 | 5.52 |
| Mid-Rad H1 | −6.92 | −1.52 | 4.45 | 3.76 |
| Mid-Rad H2 | 6.85 | 1.17 | 5.97 | 5.87 |
| Edge H1 | −7.00 | 2.81 | 5.42 | 4.89 |
| Edge H2 | 4.96 | 0.50 | 7.49 | 7.82 |

TABLE 6B

|  | Centre | Mid-Rad | Edge | A/P Range |
|---|---|---|---|---|
| H1 - 100 | 32 | 32 | 35 | 3 |
| H1-111 | 22 | 21 | 22 | 1 |
| H2-100 | 27 | 38 | 30 | 11 |
| H2-111 | 29 | 22 | 31 | 9 |

Example 7 (Inventive)

A plate 7.5 mm thick was made, using the same powder-metallurgy process as was described above, (steps 1 to 6), resulting in a puck 165 mm diameter and 42 mm thick.
It was then rolled to thickness. A 5-degree tilt angle was used. The thickness of the piece was reduced by approximately 5-10% in each pass. The piece was rotated 45 degrees about a vertical axis after each pass. The piece was turned over after every 4 passes. The final thickness of the piece after rolling was 7.5 mm. The finish-processing (annealing etc.) was performed conventionally.
Samples were taken from the centre of the plate, the mid-radius of the plate and the edge of the plate, and the texture determined by EBSD, using a 15 μm step in both horizontal and vertical directions. The results are presented here (FIGS. 7A, 7B, 7C and 7D) in the same way as for Example 1, except that the width examined was 1.64 mm rather than 1.5 mm, and the graph shows area percentage from 0% to 60% rather than 0% to 70%. The average grain size was about ASTM 6½ (32 microns ALI).

TABLE 7A

|  | 100 Grad | 111 Grad | 100 BF | 111 BF |
|---|---|---|---|---|
| Centre H1 | −1.78 | 2.10 | 3.46 | 3.21 |
| Centre H2 | 1.60 | 1.85 | 4.09 | 4.45 |
| Mid-Rad H1 | −1.11 | 1.20 | 3.94 | 3.77 |
| Mid-Rad H2 | 2.84 | 2.70 | 4.46 | 4.82 |
| Edge H1 | −1.06 | 0.97 | 3.46 | 3.68 |
| Edge H2 | 0.54 | 0.50 | 2.45 | 4.47 |

TABLE 7B

|  | Centre | Mid-Rad | Edge | A/P Range |
|---|---|---|---|---|
| H1 - 100 | 23 | 20 | 18 | 5 |
| H1-111 | 27 | 29 | 28 | 2 |
| H2-100 | 27 | 23 | 21 | 6 |
| H2-111 | 29 | 28 | 27 | 2 |

Example 8 (Inventive)

Three plates about 8 mm thick were made using the ingot-metallurgy process described above, including the following process details:
1) Clean the surface of the ingot by machining. Cut the ingot (195 mm diameter) to length, 374 mm, resulting in a weight of 474 lbs.
2) Upset forge (U1) the billet to 65% of initial billet length
3) Anneal (A1) billet at 1370 C
4) Forge-back billet to 197 mm diameter (FB1)
5) Upset forge (U2) billet to 65% of initial billet length
6) Forge-back billet to 197 mm diameter (FB2)
7) Anneal (A2) billet at 1065 C
8) Upset forge (U3) billet to 65% of initial billet length 9) Forge-back the billet to 133 mm diameter (FB3). Clean the surface by machining, thus reducing the billet diameter to 127 mm 10) Cut the billet to length, 68.6 mm 11) Upset forge (U4) billet to 50.8 mm 11) Anneal (A3) billet at 1065 C 12) Roll to 25.4 mm thickness using conventional (straight) rolling. The thickness of the piece was reduced by approximately 20% in each pass. The piece was rotated 90 degrees about a vertical axis after each pass.

13) Roll to final thickness. A 5-degree tilt angle was used. The thickness of the piece was reduced by approximately 10% in each pass. The piece was rotated 45 degrees about a vertical axis after each pass. The piece was turned over after every pass. The final thickness of the piece after rolling was 8 mm 14) Anneal (A4) at 955 C 15) Flatten.

In the case of 1 plate, samples were taken from the centre of the plate, the mid-radius of the plate and the edge of the plate (2 samples, well separated), and the texture determined by EBSD, using a 15 μm step in both horizontal and vertical directions. The results are presented in FIGS. 8A, 8B, 8C, 8D and 8E, and in Tables 8A and 8B, in the same way as for Example 1. In the case of the other 2 plates, only edge samples (2 samples, well separated) were taken. The average grain size was about ASTM 7½ (24 microns ALI).

TABLE 8A

|  | 100 Grad | 111 Grad | 100 BF | 111 BF |
|---|---|---|---|---|
| Plate 1 |  |  |  |  |
| Centre H1 | −1.40 | −0.63 | 3.97 | 4.31 |
| Centre H2 | 2.12 | −3.04 | 5.12 | 4.51 |
| Mid-Rad H1 | −3.18 | 1.58 | 4.09 | 4.85 |
| Mid-Rad H2 | 2.14 | −4.04 | 3.55 | 4.47 |
| Edge 1 H1 | −5.33 | 1.96 | 4.62 | 5.23 |
| Edge 1 H2 | −1.50 | −0.73 | 4.17 | 5.31 |
| Edge 2 H1 | −4.35 | 0.46 | 3.55 | 6.33 |
| Edge 2 H2 | 4.66 | −1.68 | 4.35 | 4.73 |
| Plate 2 |  |  |  |  |
| Edge 1 H1 | −5.30 | 4.78 | 5.51 | 3.68 |
| Edge 1 H2 | 1.25 | −0.59 | 4.46 | 4.33 |
| Edge 2 H1 | −1.74 | −0.46 | 5.78 | 4.79 |
| Edge 2 H2 | −0.88 | 2.65 | 5.87 | 5.26 |
| Plate 3 |  |  |  |  |
| Edge 1 H1 | −7.56 | 1.57 | 4.74 | 4.50 |
| Edge 1 H2 | 4.08 | −2.21 | 3.91 | 4.68 |
| Edge 2 H1 | 0.07 | 2.35 | 5.33 | 5.43 |
| Edge 2 H2 | −0.71 | −4.67 | 6.62 | 5.33 |

TABLE 8B

| Plate 1 | Centre | Mid-Rad | Edge 1 | Edge 2 | A/P Range |
|---|---|---|---|---|---|
| H1 -100 | 30.3 | 28.5 | 26.6 | 26.6 | 3.7 |
| H1 - 111 | 30.5 | 25.9 | 29.3 | 27.6 | 4.6 |
| H2 - 100 | 28.3 | 25.0 | 21.7 | 23.9 | 6.6 |
| H2 - 111 | 32.7 | 30.5 | 31.1 | 28.5 | 4.2 |

Summary

The examples of the invention can be conveniently compared to the four examples of the old art in the following summary table. To calculate the average gradient, the absolute value of each individual gradient value is used. The Max. Grad. shown is the maximum found in any of the samples taken, which in the case of all the inventive examples, includes edge, mid-radius and centre locations. The lower each value is, the more uniform the texture of the plate.

TABLE 9

|  | Ave Grad | Max Grad | Ave BF | Max BF | Ave A/P Range | Max A/P Range |
|---|---|---|---|---|---|---|
| Example 1 | 6.4 | 14.4 | 7.3 | 9.2 | 13.2 | 22 |
| Example 2 | 8.1 | 13.3 | 6.0 | 7.9 | 6.4 | 8.1 |
| Example 3 | 5.6 | 9.0 | 5.3 | 7.9 | 4.7 | 7.6 |
| Example 4 | 6.8 | 15.1 | 4.7 | 7.7 | N/A | N/A |
| Example 5 | 2.9 | 8.5 | 6.0 | 7.8 | 3.7 | 7 |
| Example 6 | 4.0 | 7.0 | 5.6 | 7.8 | 6.0 | 11 |
| Example 7 | 1.5 | 2.8 | 3.9 | 4.5 | 3.7 | 6 |
| Example 8 | 2.5 | 7.6 | 4.9 | 6.6 | 4.8 | 6.6 |

N/A means "Not Available".

It can be seen from Table 9 (in which Examples 3 and 7 use powder metallurgy, and the others use ingot metallurgy) that:

1) All the comparative examples have average gradients above 5% per mm.

2) Of the comparative examples, Example 3 (powder metallurgy method) has more uniform texture than Examples 1, 2 and 3 (ingot metallurgy).

3) All the inventive examples have average gradients below 5% per mm, and some examples of both powder metallurgy and ingot metallurgy have average gradients less than half those of the relevant comparative examples.

4) Of the inventive examples, Example 7 (powder metallurgy) has more uniform texture than Examples 5, 6 and 8 (ingot metallurgy).

5) The banding factors and A/P ranges in some inventive examples are not just equivalent to, but are actually lower than, the relevant comparative examples.

Also, it is instructive to compare Examples 3, 4 and 8, because the multiplicity of plates in each of these examples allows statistical analysis and thus comparison of variability of texture from plate to plate. The edge samples (19 samples from Example 4, 6 samples from each of the other examples) are compared in Table 10.

TABLE 10

|  | 100% | 111% | 100 Grad | 111 Grad | 100 BF | 111 BF |
|---|---|---|---|---|---|---|
| Ex. 4 Average | 19.3 | 32.0 | 5.4 | 8.7 | 4.7 | 7.5 |
| Ex. 4 Std. Dev. | 3.9 | 5.3 | 1.60 | 2.78 | 1.42 | 1.82 |
| Ex. 3 Average | 24.3 | 30.5 | 6.1 | 6.0 | 4.4 | 5.7 |
| Ex. 3 Std. Dev. | 2.15 | 1.99 | 1.47 | 2.04 | 0.53 | 0.88 |
| Ex. 8 Average | 27.7 | 27.2 | 3.1 | 2.0 | 4.9 | 5.0 |
| Ex. 8 Std. Dev. | 3.80 | 2.11 | 2.38 | 1.48 | 0.91 | 0.67 |

Although standard deviations from 12 data-points are not very accurate, it can be seen that the variability in Example 8 (as shown by the Standard Deviations of Table 10) is similar to that in Examples 3 and 4. The lower average gradients of Example 8, compared to Examples 3 and 4, are high-lighted in the table.

Whereas particular embodiments of this invention have been described above for purposes of illustration, it will be evident to those skilled in the art that numerous variations of the details of the present invention may be made without departing from the invention as defined in the appended claims.

What is claimed is:

1. A refractory metal plate having a center, a thickness, an edge, a top surface and a bottom surface, the refractory metal plate having a crystallographic texture as characterized by through thickness gradient, banding severity; and variation across the plate, for each of the texture components 100//ND and 111//ND using electron back-scatter diffraction with a 15 μm step in both the horizontal and vertical directions for each measurement, wherein the average through-thickness gradient is less than or equal to 3% per mm for 100//ND and 111//ND.

2. The refractory metal plate of claim 1, wherein the metal plate is at least 99.95% pure refractory metal.

3. The refractory metal plate of claim 2, wherein the metal plate has a grain size that is less than 60 μm.

4. The refractory metal plate of claim 3, wherein the metal plate is at least 99.995% pure refractory metal.

5. The refractory metal plate of claim 4, wherein the refractory metal is tantalum.

6. The refractory metal plate of claim 4, wherein the refractory metal is niobium.

7. The refractory metal plate of claim 1, wherein the metal plate is manufactured by ingot metallurgy and the metal plate is a sputtering target.

8. The refractory metal plate of claim 1, wherein the metal plate is manufactured by powder metallurgy and the metal plate is a sputtering target.

9. The refractory metal plate of claim 8, wherein the metal plate is manufactured using a process including rolling the plate asymmetrically, wherein the asymmetric rolling is carried out on an inclined plane having an angle of incline between 2 and 20 degrees.

10. The refractory metal plate of claim 8, wherein the metal plate has a texture as characterized by through-thickness gradient, where the average through-thickness gradient for the texture components 100//ND and 111//ND is less than or equal to 2% per mm.

11. The refractory metal plate of claim 8, wherein the metal plate has an average banding severity of 6% or less for 100//ND and 111//ND.

12. The refractory metal plate of claim 11, wherein the metal plate has an average banding severity of 5% or less for 100//ND and 111//ND.

13. The refractory metal plate of claim 12, wherein the metal plate has an average variation across the plate of less than or equal to 4%.

14. The refractory metal plate of claim 1, wherein the texture is determined from grains maps with grains separately identified for 100 and 111 within 15° of the normal direction.

15. A refractory metal plate having a center, a thickness, an edge, a top surface and a bottom surface, the refractory metal plate having a crystallographic texture as characterized by
through thickness gradient;
banding severity; and
variation across the plate,
for the texture components 100//ND and 111//ND using electron back-scatter diffraction with a 15 μm step in both the horizontal and vertical directions for each measurement,
wherein the average banding severity is less than or equal to 6% for 100//ND and 111//ND;
wherein the refractory metal plate is manufactured by ingot metallurgy.

16. The refractory metal plate of claim 15, wherein the metal plate is at least 99.95% pure refractory metal, the metal plate has a grain size that is less than 60 μm, and the metal plate is a sputtering target.

17. The refractory metal plate of claim 16, wherein the refractory metal is tantalum or niobium, the metal plate is a sputtering target, and the metal plate has a purity of at least 99.995% refractory metal.

18. A refractory metal plate having a center, a thickness, an edge, a top surface and a bottom surface, the refractory metal plate having a crystallographic texture as characterized by
banding severity for the texture components 100//ND and 111//ND using electron back-scatter diffraction with a 15 μm step in both the horizontal and vertical directions for each measurement,
wherein the average banding severity is less than or equal to 5% for 100//ND and 111//ND.

19. The refractory metal plate of claim 18, wherein the metal plate is manufactured by powder metallurgy and the average through-thickness gradient is less than 2%/mm for 100//ND and 111//ND.

20. The refractory metal plate of claim 19, wherein the refractory metal is tantalum or niobium, the metal plate is a sputtering target, and the metal plate has a purity of at least 99.995% refractory metal.

* * * * *